(12) United States Patent
Huang et al.

(10) Patent No.: US 12,132,042 B2
(45) Date of Patent: Oct. 29, 2024

(54) STRAP TECHNOLOGY TO IMPROVE ESD HBM PERFORMANCE

(71) Applicant: Taiwan Semiconductor Manufacturing Company, Ltd., Hsinchu (TW)

(72) Inventors: Hsiao-Ching Huang, New Taipei (TW); Sheng-Fu Hsu, Hsinchu (TW); Hao-Hua Hsu, Taipei (TW); Pin-Chen Chen, New Taipei (TW); Lin-Yu Huang, Hsinchu (TW); Yu-Chang Jong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 18 days.

(21) Appl. No.: 17/872,471

(22) Filed: Jul. 25, 2022

(65) Prior Publication Data

US 2024/0030215 A1 Jan. 25, 2024

(51) Int. Cl.
*H01L 27/02* (2006.01)
*H01L 21/8249* (2006.01)

(52) U.S. Cl.
CPC ...... *H01L 27/0288* (2013.01); *H01L 21/8249* (2013.01); *H01L 27/0277* (2013.01); *H01L 27/0296* (2013.01)

(58) Field of Classification Search
CPC ............. H01L 27/0288; H01L 27/0277; H01L 27/0296; H01L 21/8249
USPC ........................................................ 257/378
See application file for complete search history.

(56) References Cited

U.S. PATENT DOCUMENTS

| | | | | |
|---|---|---|---|---|
| 2003/0197246 A1* | 10/2003 | Ker | ...................... | H01L 27/0266 257/565 |
| 2011/0260254 A1* | 10/2011 | Kim | .................... | H01L 27/0277 257/355 |
| 2012/0032243 A1* | 2/2012 | Kutsukake | ............. | H10B 41/30 257/E29.345 |

FOREIGN PATENT DOCUMENTS

| CN | 101866922 | * | 10/2010 |
|---|---|---|---|
| CN | 102024811 | * | 4/2011 |
| CN | 110504253 | * | 11/2019 |
| CN | 114429950 | * | 5/2022 |

* cited by examiner

*Primary Examiner* — Sheng-Bai Zhu
(74) *Attorney, Agent, or Firm* — Eschweiler & Potashnik, LLC

(57) ABSTRACT

The ability of a grounded gate NMOS (ggNMOS) device to withstand and protect against human body model (HBM) electrostatic discharge (ESD) events is greatly increased by resistance balancing straps. The resistance balancing straps are areas of high resistance formed in the substrate between an active area that includes a MOSFET of the ggNMOS device and a bulk ring that surrounds the active area. A Vss rail is coupled to the substrate beneath the MOSFET through the bulk ring. The substrate beneath the MOSFET provides base regions for parasitic transistors that switch on for the ggNMOS device to operate. The straps inhibit low resistance pathways between the base regions and the bulk ring and prevent a large portion of the ggNMOS device from being switched off while a remaining portion of the ggNMOS device remains switched on. The strap may be divided into segments inserted at strategic locations.

20 Claims, 20 Drawing Sheets

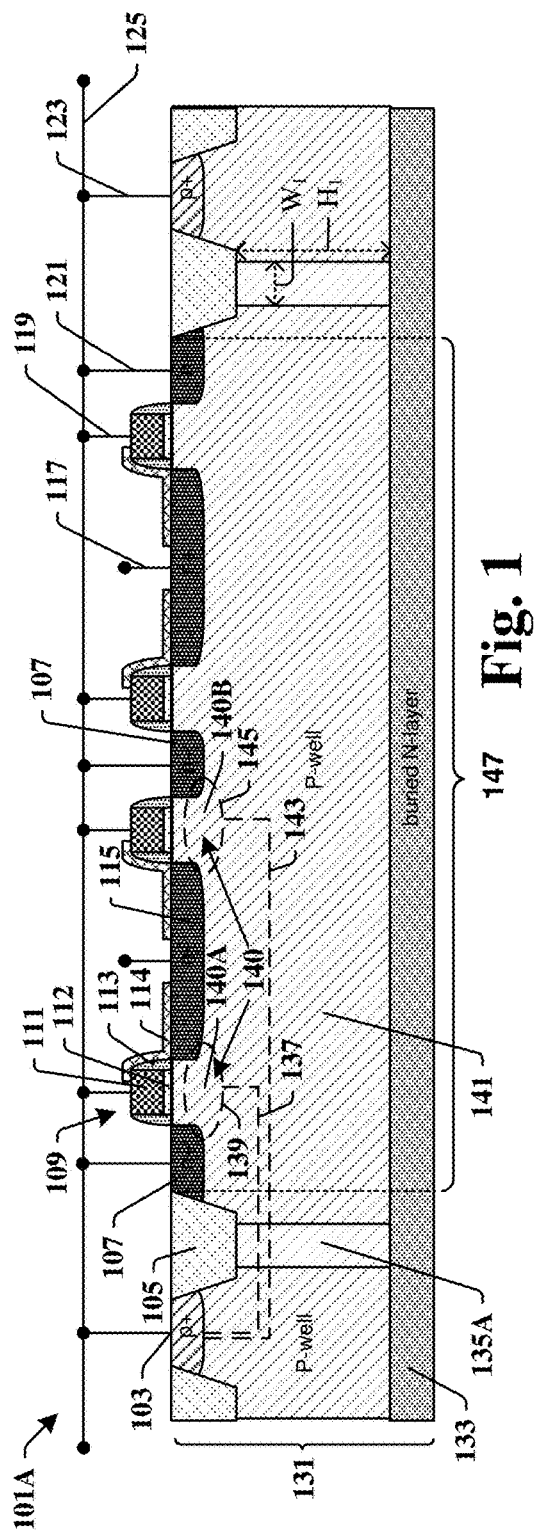
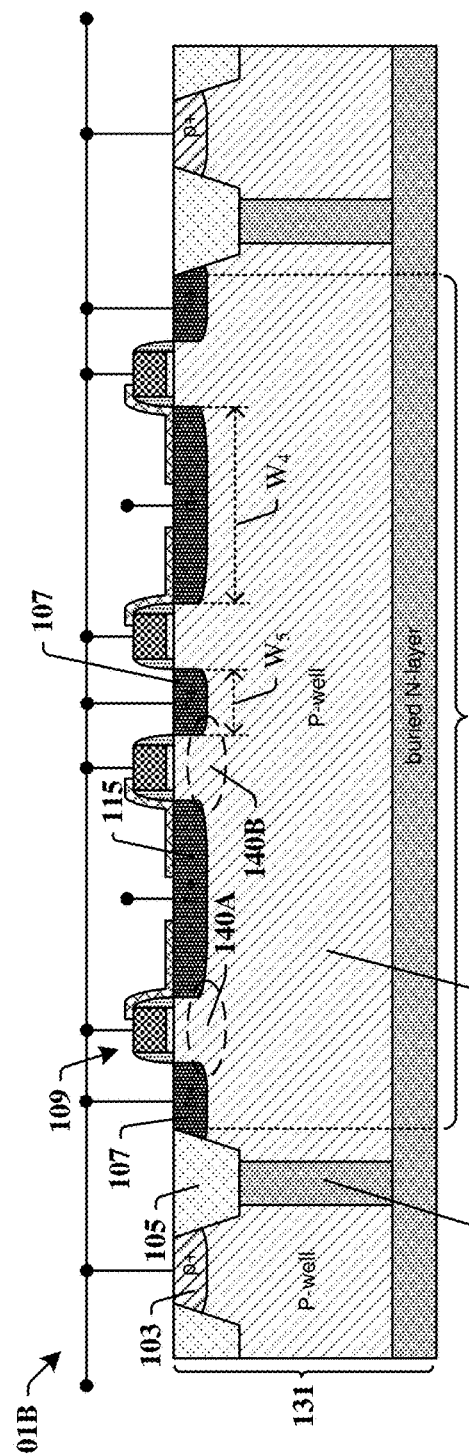

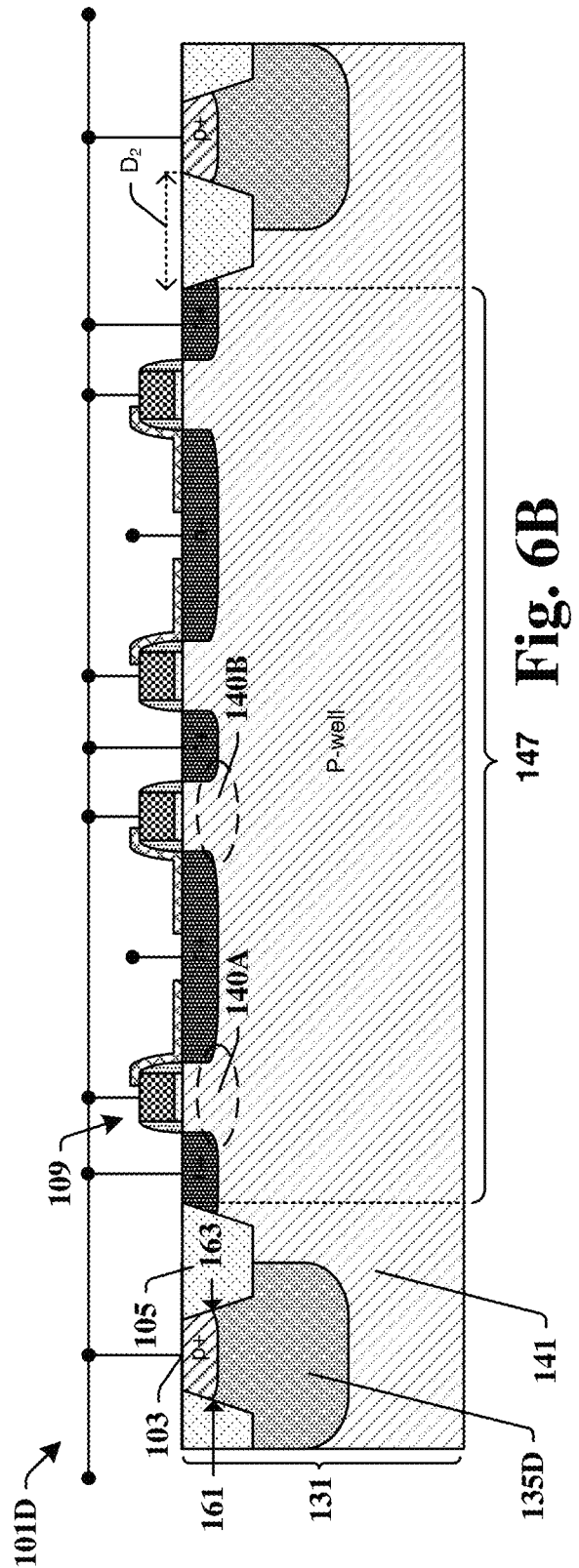

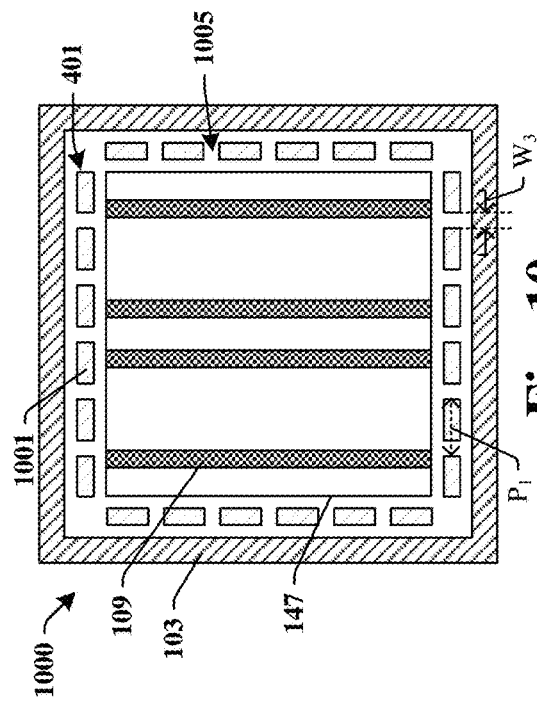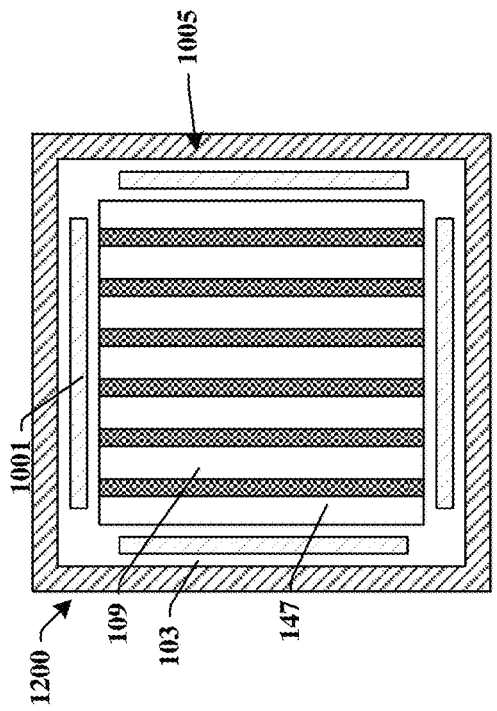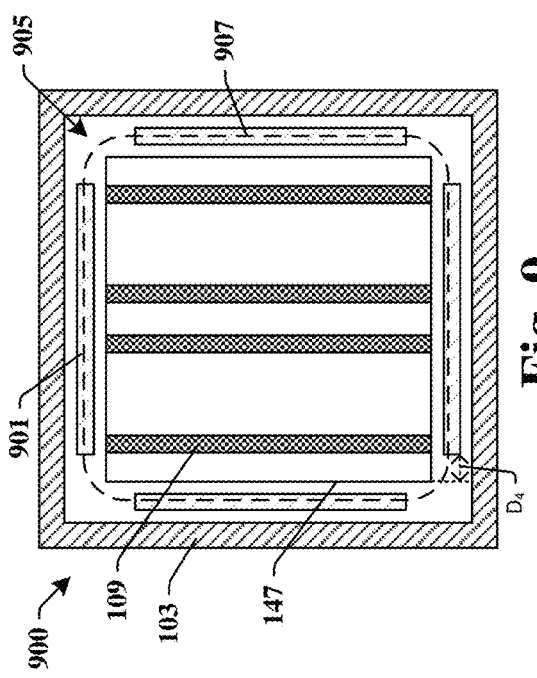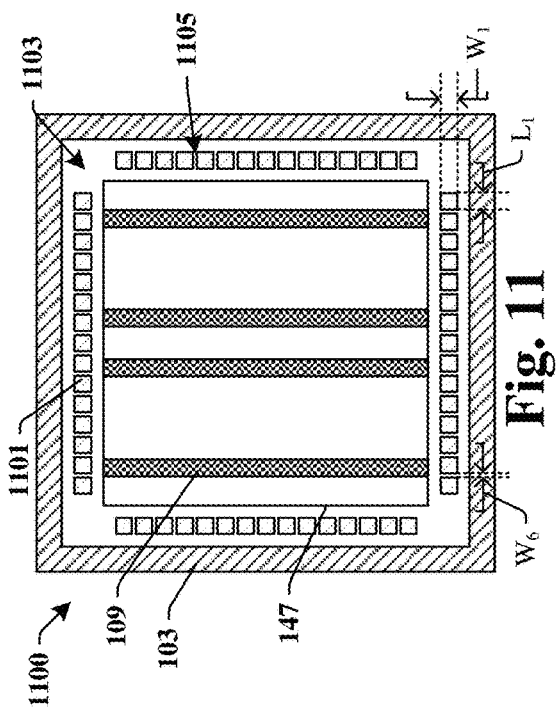

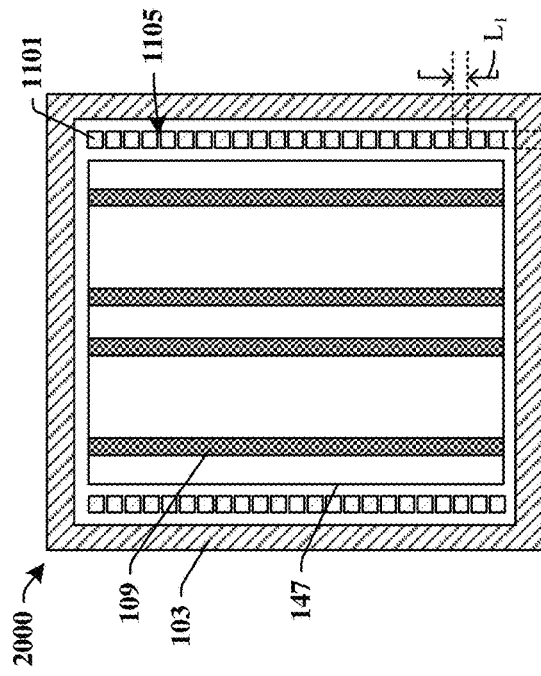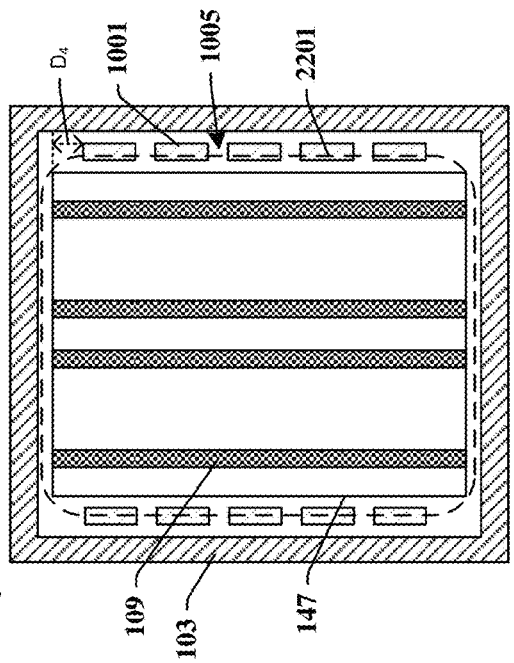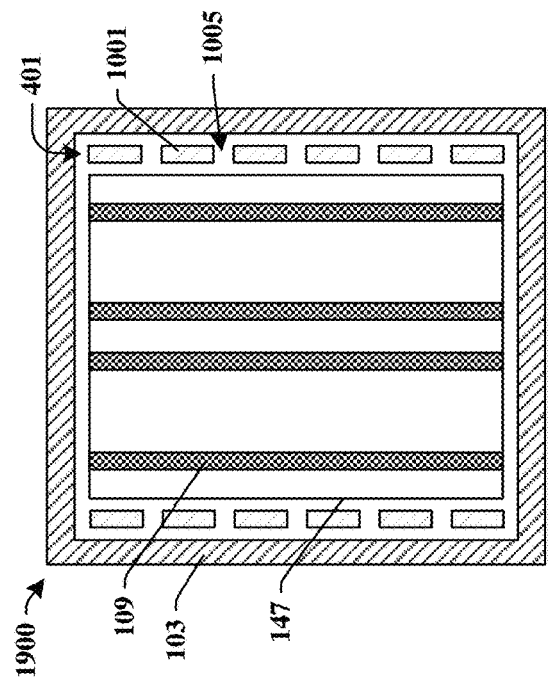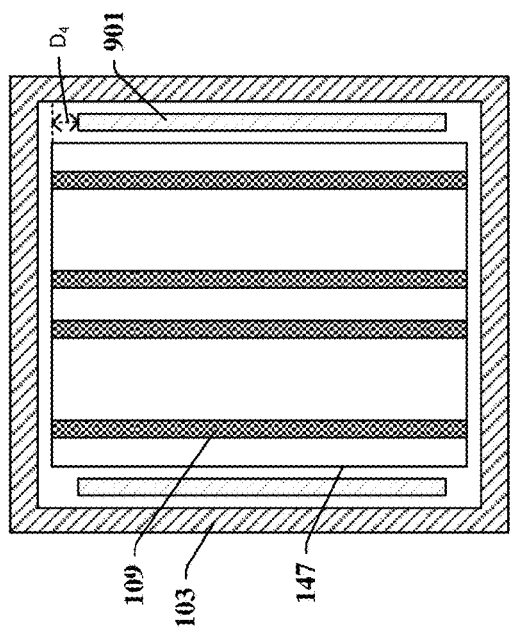

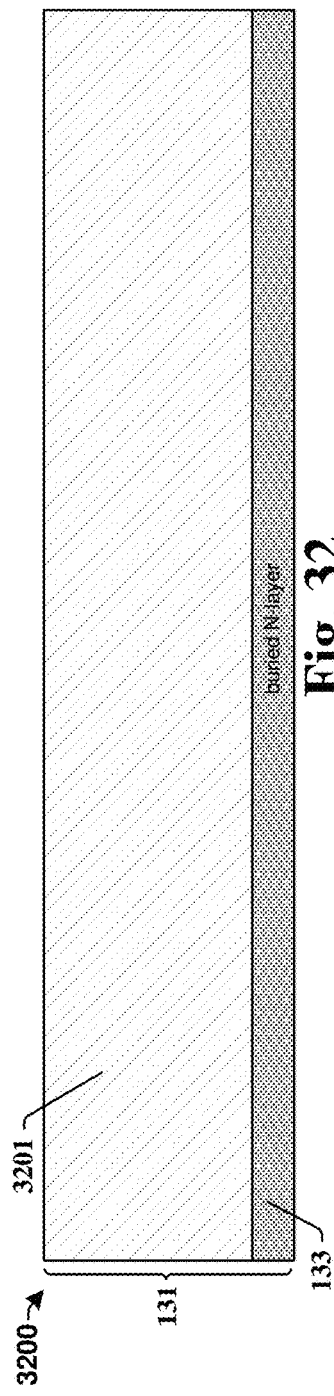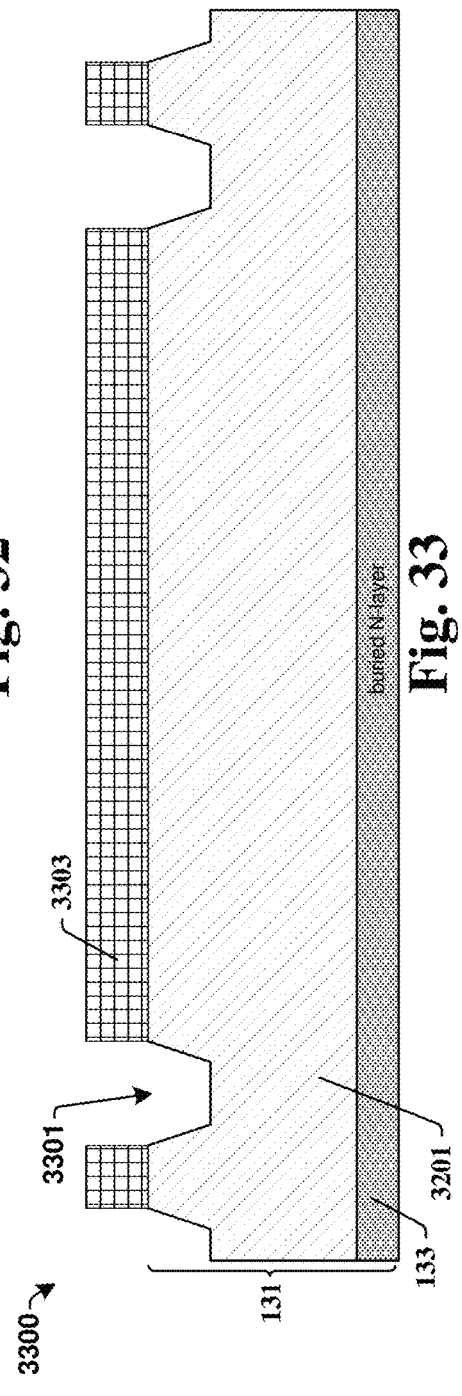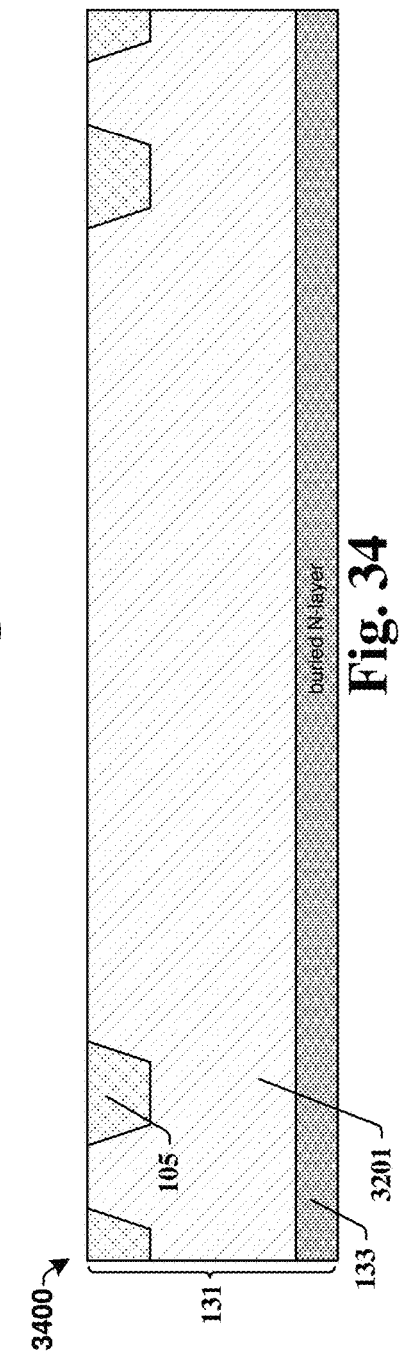

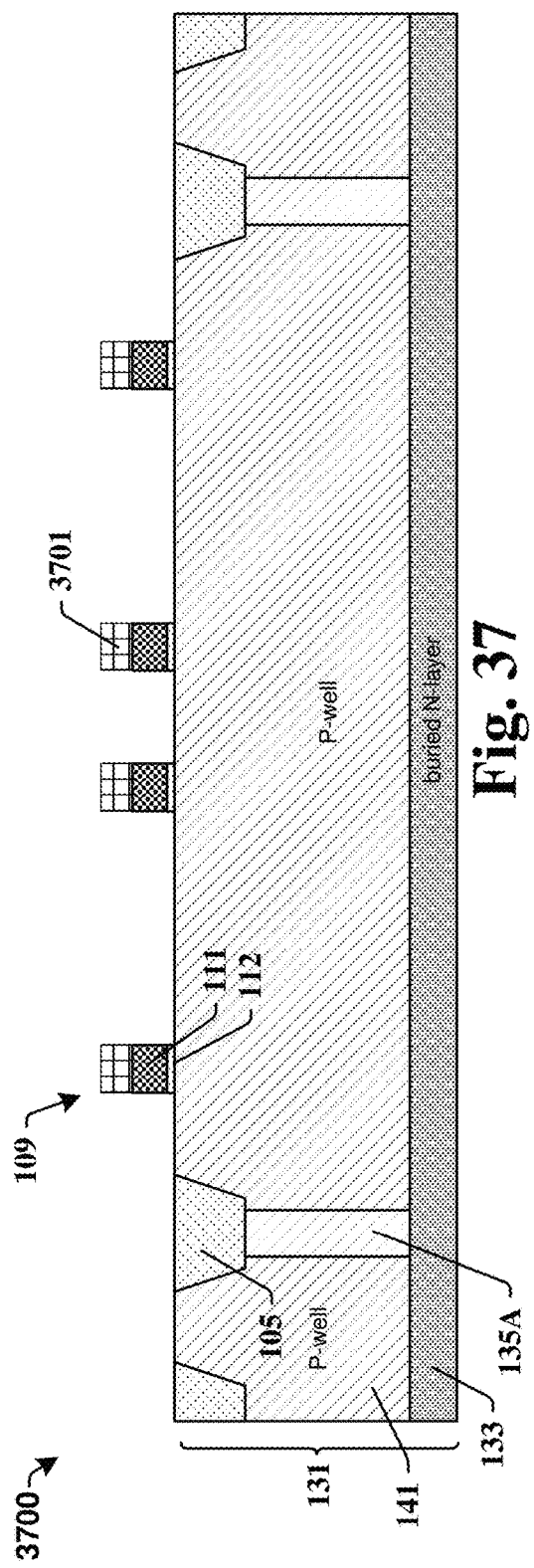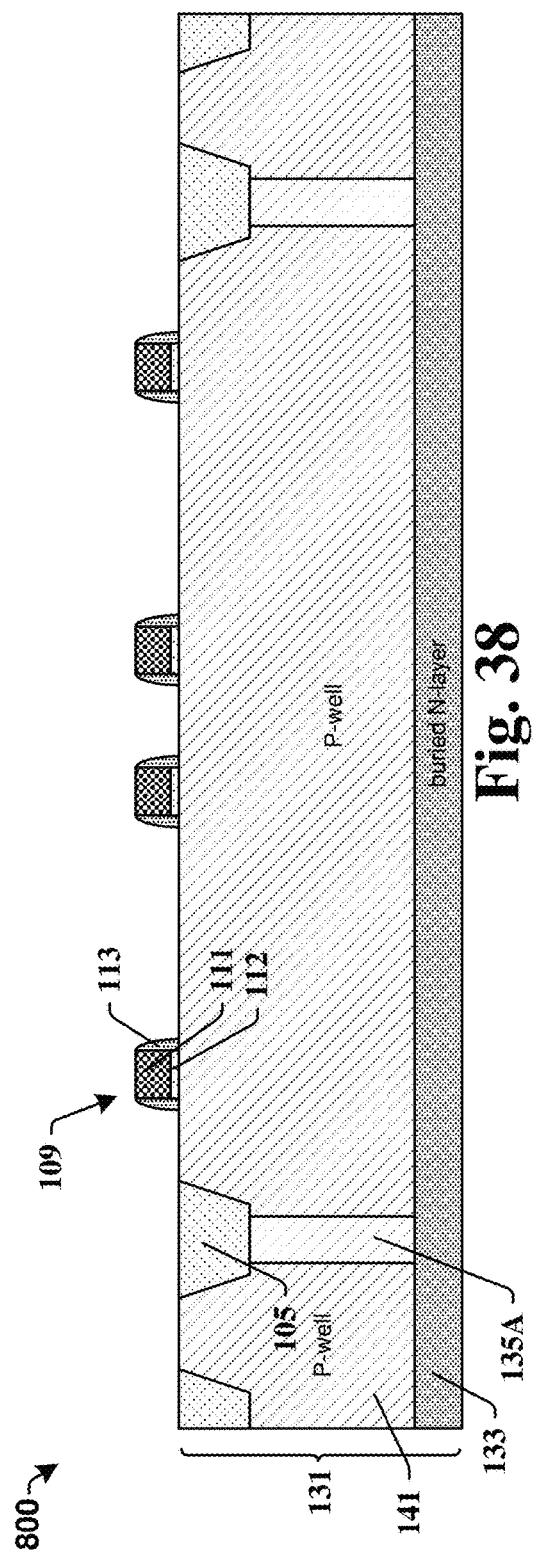

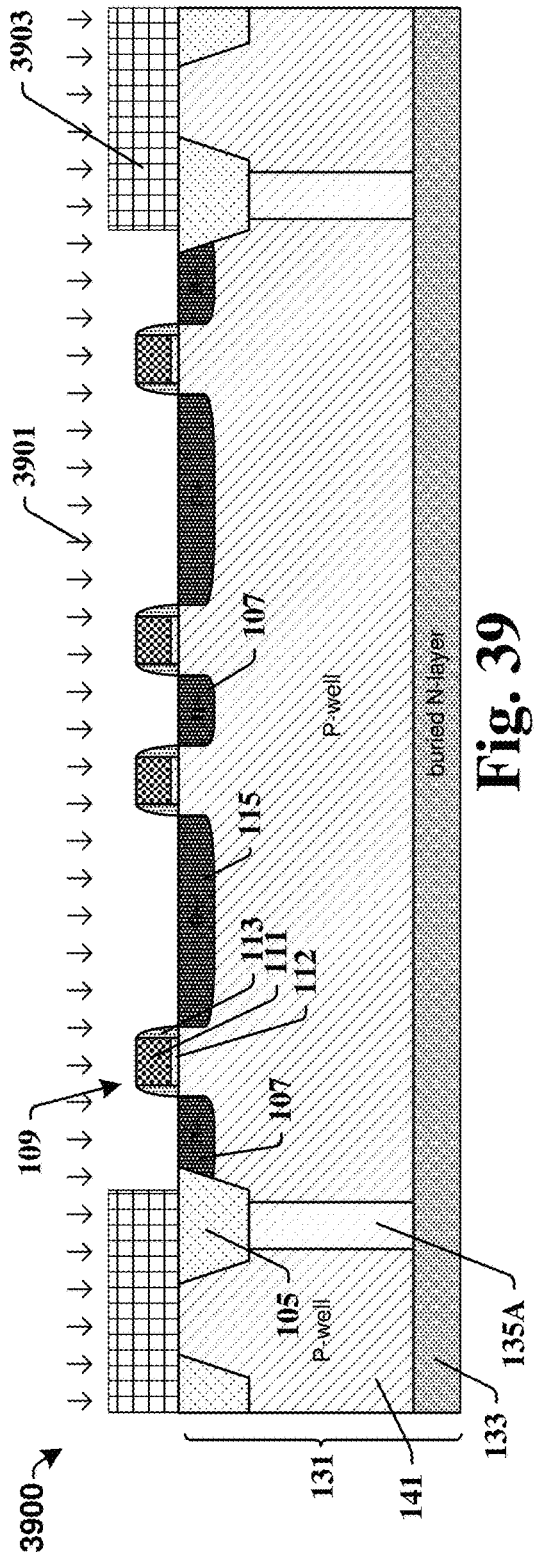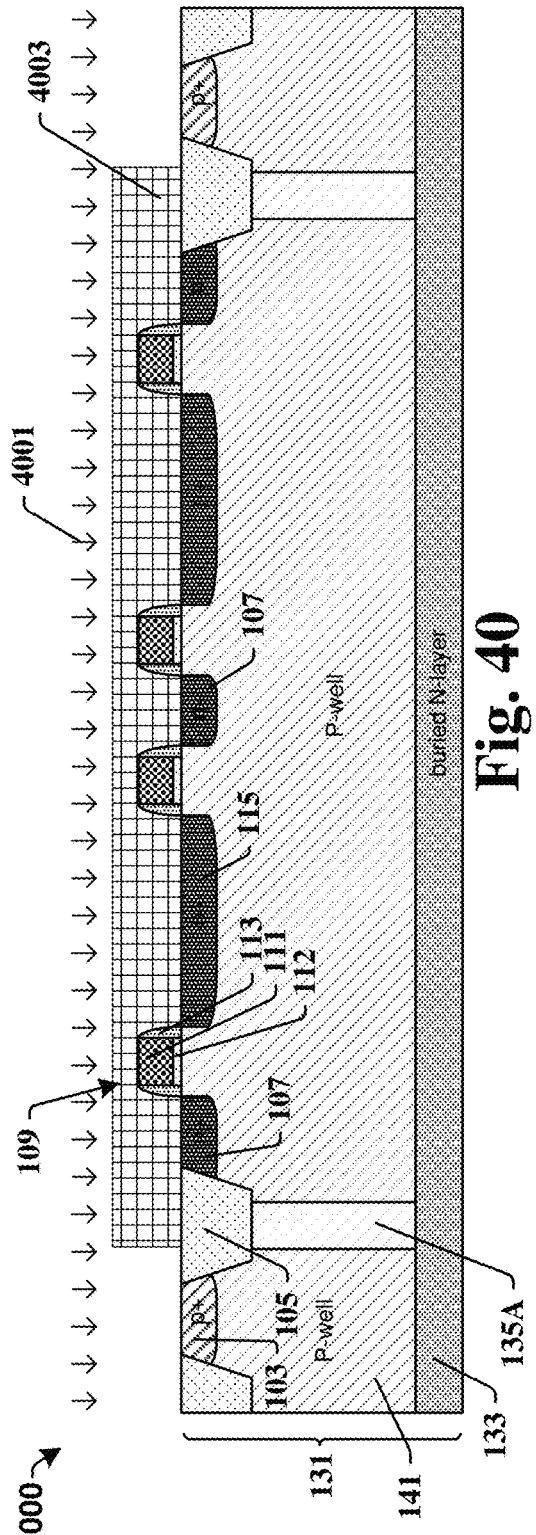

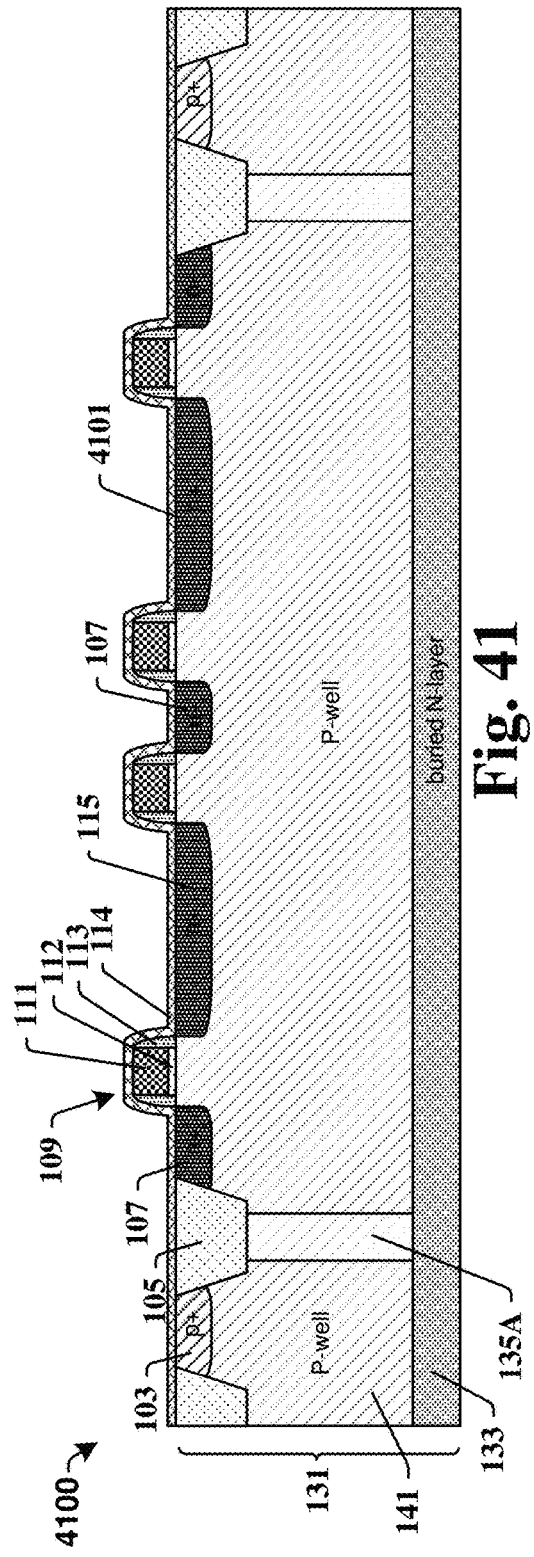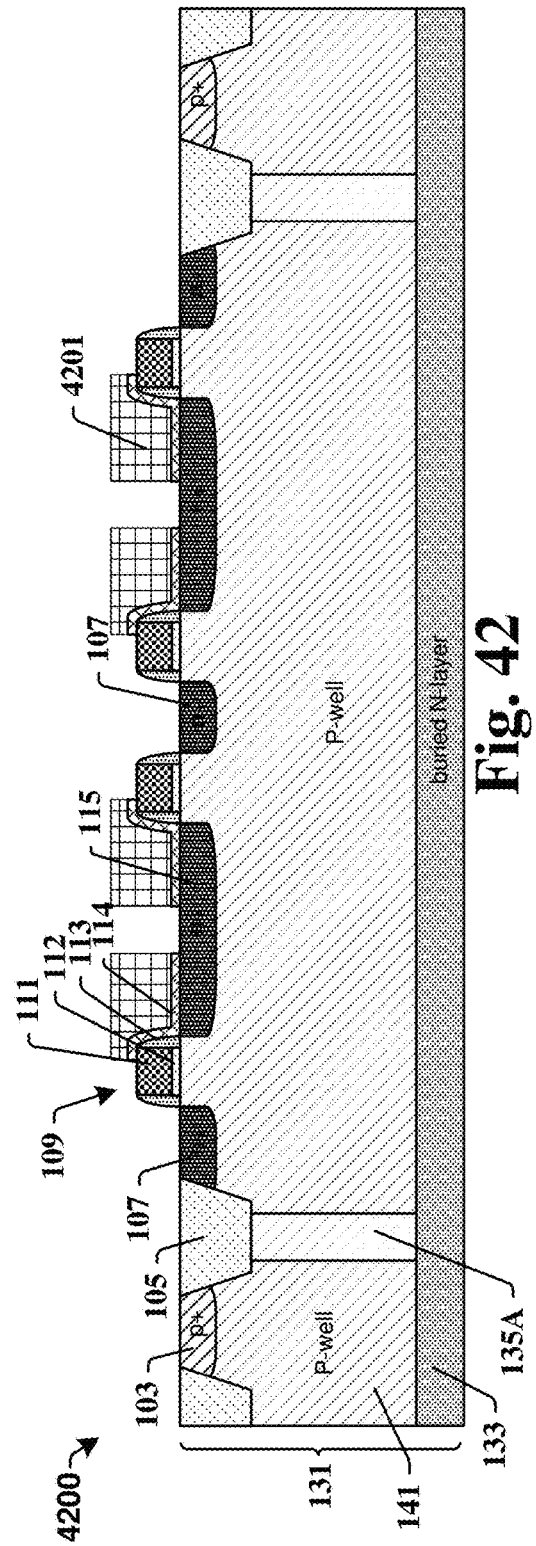

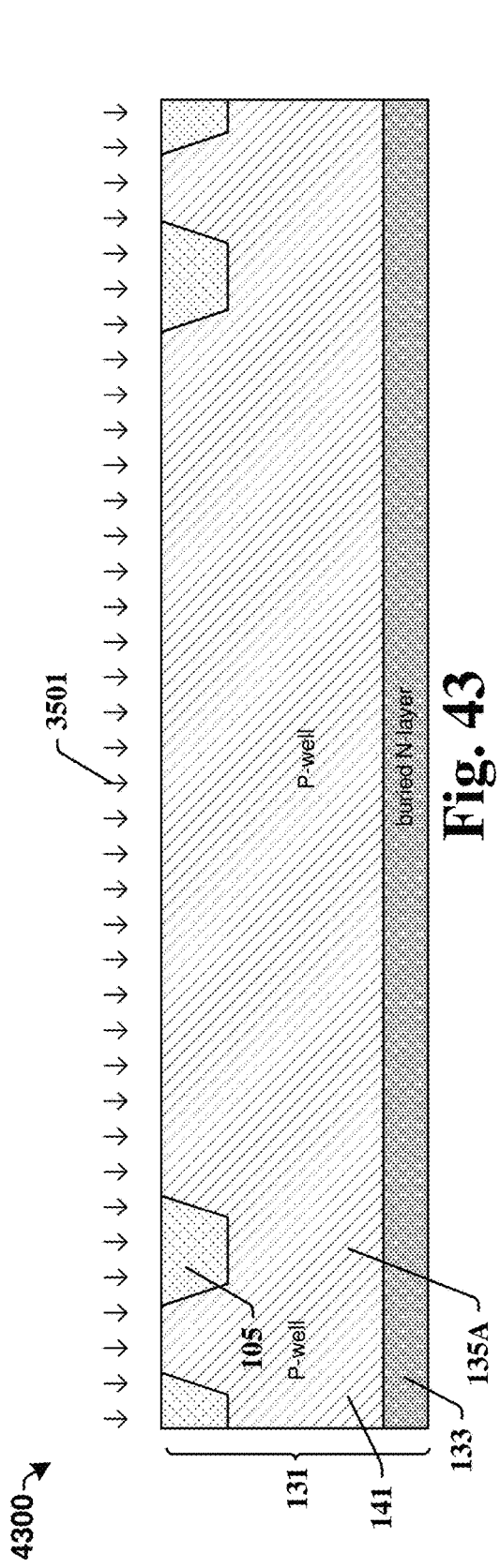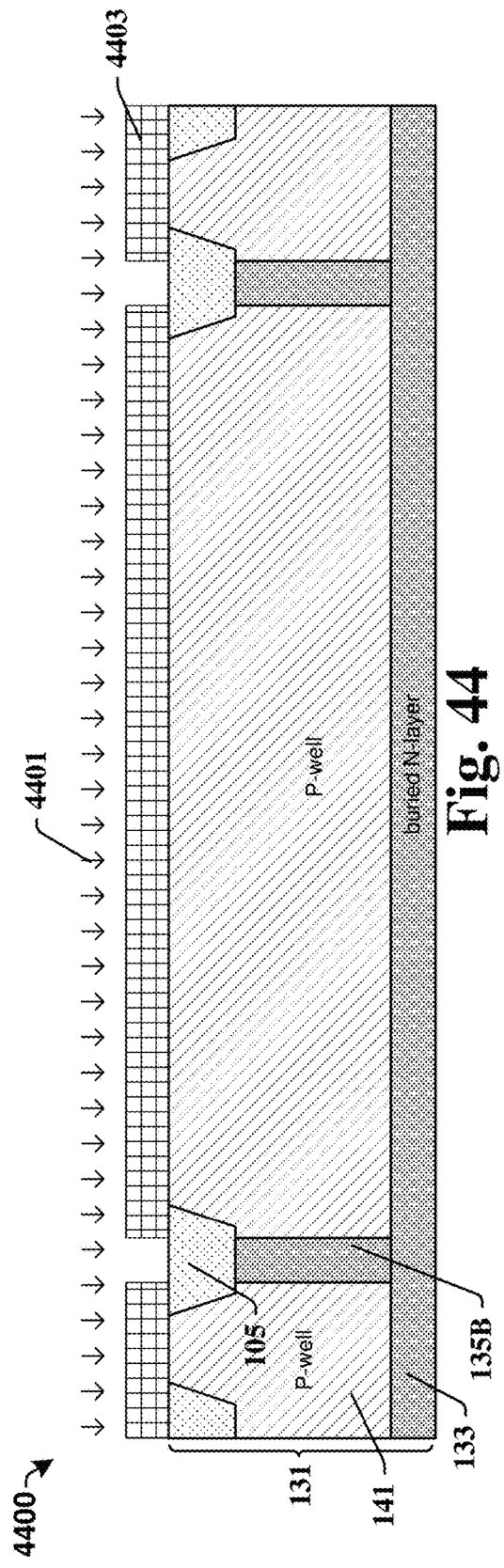

STRAP TECHNOLOGY TO IMPROVE ESD HBM PERFORMANCE

BACKGROUND

Electrostatic discharge (ESD) protection devices are used to protect integrated circuits. ESD protection is particularly difficult with BCD (Bipolar-CMOS-DMOS) technology. BCD technology combines multiple process technologies to provide multiple functions on a single integrated chip. Those technologies include bipolar technology for implementing analog functions, complementary metal oxide semiconductor (CMOS) technology for digital functions, and double diffused metal oxide semiconductor (DMOS) technology for power and high voltage devices. The resulting integrated chips have both high and low voltage areas. In conjunction with ever diminishing critical dimensions, these combinations result in a diminished electrically safe operating area (e-SOA).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional side view of an ESD protection device according to some embodiments of the present disclosure.

FIG. 2 illustrates a cross-sectional side view of an ESD protection device according to some other embodiments of the present disclosure.

FIGS. 6A and 6B illustrates cross-sectional side views of ESD protection devices according to two embodiments of the present disclosure that may correspond with the plan view of FIG. 5.

FIGS. 9-12 illustrate plan views of ESD protection devices according to various embodiments of the present disclosure.

FIGS. 15-22 illustrate plan views of ESD protection devices according to various embodiments of the present disclosure that may be used in the IC of FIG. 14.

FIGS. 32-42 are a series of cross-sectional view illustrations exemplifying a method of the present disclosure for forming ESD devices according to the present disclosure.

FIGS. 43-44 illustrate a variation of the method of FIGS. 32-42 that is used in some embodiments.

DETAILED DESCRIPTION

Figure 3:
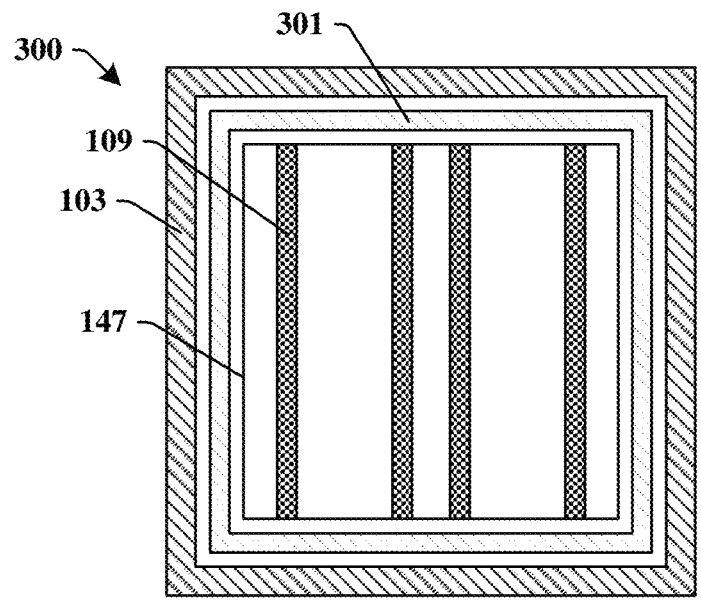
FIGS. 3-5 illustrate plan views of ESD protection devices according to various embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Grounded-gate N-channel metal-oxide-semiconductor (ggNMOS) ESD protection devices have advantages including low trigger voltage, low power dissipation, and full compatibility with Bipolar-CMOS-DMOS (BCD) technology. A ggNMOS ESD protection device (ggNMOS device) may be located between an I/O pad and a core circuit which is protected by the device. The ggNMOS device includes an N-channel metal-oxide-semiconductor field effect transistor (MOSFET) within an active area. The I/O pad is coupled to a drain region of the MOSFET. A gate, a source region, and a base region of the MOSFET are all coupled to a Vss rail or the like. The base region is a portion of a P-well. The P-well is coupled to the Vss rail through a substrate contact that is outside the active area. The substrate contact may be a bulk ring that surrounds the active area.

A parasitic NPN transistor is formed between the source region, the drain region, and the base region of the MOSFET. When an electrical pulse is applied to the I/O pad, impact ionization and avalanche breakdown occur at the drain region and current flows from the drain region into the base region. When the base region voltage rises sufficiently, there is a base region to source region current flow that turns on the parasitic transistor. While the parasitic transistor is on, there is a high discharge current from the drain region to the source region.

The active area is determined according to a desired current carrying capacity for the ggNMOS device. To utilize that active area while maintaining channel width, the MOSFET may be provided as a plurality of fingers each extending across the active area. The base region of the MOSFET includes locations under each of those fingers. Resistance between the base region and the bulk ring varies in relationship to distance from the bulk ring. For locations near the bulk ring where resistance is low, it has been found that current flow to the bulk ring may cause the voltage to drop to a degree that the parasitic transistor in that area switches off. Simultaneously, at locations further from the bulk ring, the parasitic transistor may remain on. The turning off of the parasitic transistor at some locations causes higher current loads at locations where the parasitic transistor remains on. It has been found that this effect may be of such magnitude that a ggNMOS device of theoretically sufficient area fails under an ordinary ESD event such as one represented by the Human Body Model (HBM).

The present disclosure provides a solution to this problem in the form of resistance-balancing straps inserted into the substrate at strategic locations between the active area and the bulk ring. The resistance-balancing straps increase resistance between the bulk ring and the base region in such a way that the effect of variation in resistance among base region locations is reduced. The ability of the ggNMOS device to withstand and protect against HBM ESD events is thereby greatly increased.

In some embodiments, the straps are below a depth of the MOSFET source and drain regions. In some embodiments, the straps are in the substrate directly beneath an isolation structure that surrounds the active area. In some embodiments, the straps are directly beneath the bulk ring. In some embodiments, the straps extend through the P-well. In some embodiments, the straps extend downward to a buried N-layer or the like. In some embodiments, the straps are closer to the active area than to the bulk ring. In some embodiments, the straps are closer to the bulk ring than to the active area. In a particular implementation, one of these locations may provide the best balancing of resistances.

In some embodiments the straps are P-doped regions of the substrate that have a lighter P-type doping than the surrounding P-well. In some embodiments, such straps are formed by masking the strap areas while doping the P-well that provides the base regions. In some embodiments the straps are N-doped regions of the substrate. These N-doped regions may be formed in conjunction with forming N-type wells for circuitry within the core area.

In some embodiments, the straps may completely surround the active area. The resistance through the strap may dominate other resistances between the bulk ring and various base region locations making variations that depend on distance from the bulk ring negligible. However, if the strap completely surrounds the active area, the base region may float. Accordingly, in some embodiments there are openings in the strap whereby the P-well provides path of communication between the bulk ring and the base regions that bypass the strap.

In some embodiments, the active area is rectangular and the strap comprises segments on each of the four sides of the rectangle with openings at the corners. Direct paths between the base regions and the bulk ring are formed through the corners. The base regions may be biased to the Vss rail voltage through these paths. In some embodiments, the segments have the same length as corresponding sides of the active area. In some embodiments, the area for direct current flow is increased by making the segments shorter than the corresponding sides of the active area. The area for direct current flow may be increased by locating the segments closer to the bulk ring and may be decreased by locating the segments closer to the active area.

In some embodiments the straps are slotted. In some embodiments, the slots are periodic along a segment of the strap that extends along a side of the active area. The slots divide the segment into shorter segments. In some embodiments, the slots have a frequency such that the smaller segments have lengths less than or equal to the strap width. The slots regulate current flow between the base regions and the bulk ring.

In some embodiments, the active area is rectangular and the strap is disposed on only two sides of the rectangle. In some embodiments, the two side are the two longer sides. Strap segments on these two sides alone may prove sufficient for resistance balancing. Limiting the straps to these locations maintains current flow between the active area and the bulk ring. In some embodiments, the strap segments on the two sides each have a length that is equal to a length of the active area. In some embodiments, the segments on each side span lengths that are less than the length of the active area. In some embodiments the segments are slotted. In some embodiments, the slots are disposed periodically. In some embodiments, the slots have a frequency such that the smaller segments have lengths less than or equal to the strap width. A strap having segments exhibiting a combination of one or more of these features may provide the most effective resistance balancing for a given application.

In some embodiments, one ggNMOS device according to the present disclosure is provided for each of a plurality of contact pads that are arranged along a side of a chip. The ggNMOS devices may be arranged in a row between their respective contact pads and a core area. In some embodiments, widths of the active areas may be affected by a pitch of the contact pads. In some embodiments, the active areas have widths (contact-to-contact pad direction) that are less than their lengths (contact pad-to-core area direction). In some of these embodiments, the straps have segments on their longer sides but not on their shorter sides. In some of these embodiments, the segments run parallel with the MOSFET fingers.

In some embodiments, the contact pads are not closely spaced, but the core area is large. In some embodiments, lengths of the active areas may be affected by the core area size. In some embodiments, the active areas have widths (contact-to-contact pad direction) that are greater than their lengths (contact pad-to-core area direction). In some of these embodiments, the straps have segments on their longer sides but not on their shorter sides. In some of these embodiments, the segments run perpendicular to the MOSFET fingers.

FIG. 1 illustrates an ESD protection device 101A according to some aspects of the present disclosure. The ESD protection device 101A includes MOSFET fingers 109 formed over a P-well 141 that is above a buried N-layer 133 in a semiconductor substrate 131. The MOSFET fingers 109 are within an active area 147 that is surrounded by a shallow trench isolation (STI) region 105. The ESD protection device 101A further includes a bulk ring 103 formed by a heavily P-doped area of the semiconductor substrate 131. The bulk ring 103 surrounds the active area 147, abuts the STI region 105, and is separated from the active area 147 by the STI region 105. The bulk ring 103 is directly over the P-well 141 and the buried N-layer 133.

The MOSFET fingers 109 comprise gate electrodes 111 that are over the semiconductor substrate 131 and are separated from the P-well 141 by gate dielectric 112. Source regions 107 and drain regions 115 are provided by heavily N-doped areas of the semiconductor substrate 131 aligned on opposite sides of the fingers 109 by sidewall spacers 113. Resist protective oxide (RPO) layers 114 may be disposed so as to partially cover the drain regions 115. The drain regions 115 are coupled to an I/O pad (not shown) by contact plugs 117. The bulk ring 103, the source regions 107, and the gate electrodes 111 are coupled to a Vss rail 125 by contact plugs 123, contact plugs 121, and contact plugs 119 respectively.

Portions of the P-well 141 directly beneath the fingers 109 provide base regions 140 for parasitic transistors. The base regions 140 include the first base region 140A and the second base region 140B. A first parasitic NPN transistor 139 is formed under a finger 109 that is a first distance from the bulk ring 103. The first parasitic NPN transistor 139 includes a source region 107, the first base region 140A, and a drain region 115. A second parasitic NPN transistor 145 is formed under a finger 109 that is further from the bulk ring 103. The second parasitic NPN transistor 145 includes another source region 107, the second base region 140B, and the drain region 115.

The first base region 140A communicates with the bulk ring 103 through a first path 137. The second base region 140B communicates with the bulk ring 103 through a second path 143. The first path 137 and the second path 143 go through or around a strap 135A. The first path 137 and the second path 143 are through the P-well 141 except to the extent they go through the strap 135A. The strap 135A has a much higher resistance than the P-well 141.

The resistance between the first base region 140A and the bulk ring 103 is $R_1$. The resistance between the second base region 140B and the bulk ring 103 is $R_2$. Although the second base region 140B is much further from the bulk ring 103, $R_2$ is only slightly greater than $R_1$. One possible reason is that the first path 137 and the second path 143 go through the strap 135A and the resistance along each path is dominated by the resistance through the strap 135A. Another possible reason is that the first path 137 and the second path 143 both go around the strap 135A through a bottleneck and the resistance through the bottleneck dominates other resistances along the first path 137 and the second path 143. Another possible reason is that the first path 137 and the second path 143 both go around the strap 135A and that the distance required to go around the strap 135A is much greater than direct distances between either the first path 137 or the second path 143 and the bulk ring 103. In actuality, the reason may be a combination of the foregoing.

Regardless of the particular mechanism that dominates, the strap 135A is effective to reduce a ratio between $R_2$ and $R_1$. In some embodiments, the ratio between $R_2$ and $R_1$ is 4 or more. In some embodiments, the ratio between $R_2$ and $R_1$ is 10 or more. In some embodiments the strap 135A reduces the ratio $R_2$ to $R_1$ by a factor of 2 or more. In some embodiments the strap 135A reduces the ratio $R_2$ to $R_1$ by a factor of 4 or more. In some embodiments the strap 135A reduces the ratio $R_2$ to $R_1$ by a factor of 10 or more.

The P-well 141 is a region of the semiconductor substrate 131 with P-type doping. In some embodiments, the P-well 141 is doped to a concentration in the range from about $10^{15}/cm^3$ to about $10^{19}/cm^3$. The strap 135A is a region of the semiconductor substrate 131 that is P-doped but to a lower concentration. In some embodiment, the strap 135A is doped to a concentration in the range from about $10^{12}/cm^3$ to about $10^{15}/cm^3$. In some embodiments, the resistivity of the strap 135A is 100 or more times greater than the resistivity of the P-well 141. In some embodiments, the resistivity of the strap 135A is 1000 or more times greater than the resistivity of the P-well 141. In some embodiments, the P-dopant concentration in the strap 135A is one tenth or less the P-dopant concentration in the P-well 141. In some embodiments, the P-dopant concentration in the strap 135A is one hundredth or less the P-dopant concentration in the P-well 141. In some embodiments, the P-dopant concentration in the strap 135A is one thousandth or less the P-dopant concentration in the P-well 141. Examples of P-type dopants include boron (B), aluminum (Al), gallium (Ga), indium (In), combinations thereof, and the like.

In some embodiments, the strap 135A extends through a depth of the P-well 141. In some embodiments, the strap 135A extends downward to the buried N-layer 133. In some embodiments, the strap 135A extends upward to abut the STI region 105. In some embodiments, a top of the strap 135A is below a bottom of the source regions 107. In some embodiments, the strap 135A has a height $H_1$ in a range from about 0.5 μm to about 100 μm. In some embodiments, the height $H_1$ is in the range from about 1.5 μm to about 10 μm. If the strap is sufficiently deep, the strap 135A does not need to extend through the P-well 141 and conduction under the strap 135A may be permitted. In some embodiments, the strap 135A has a width $W_1$ in a range from about 0.1 μm to about 50 μm. In some embodiments, the width $W_1$ is in the range from about 0.5 μm to about 5 μm. A lower width is suitable when some conduction through the strap 135A is to be allowed.

FIG. 2 illustrates an ESD protection device 101B according to some other aspects of the present disclosure. The ESD protection device 101B is like the ESD protection device 101A except that the ESD protection device 101B has straps 135B. The straps 135B are N-doped regions of the semiconductor substrate 131. In some embodiments, the straps 135B have N-type doping to a concentration in the range from about $10^{12}/cm^3$ to about $10^{15}/cm^3$. In some embodiments, the straps 135B have N-type doping to a concentration in the range from about $10^{15}/cm^3$ to about $10^{19}/cm^3$. Examples of N-type dopants include phosphorus (P), arsenic (As), antimony (Sb), combinations thereof, and the like.

FIG. 3 illustrates a layout 300 for an ESD protection in accordance with some embodiments. In the example layout 300, a strap segment 301 completely surrounds the active area 147. The strap segment 301 may correspond to the strap 135A of FIG. 1. While layout 300 is effective for resistance-balancing, communication between the bulk ring 103 and the base regions 140 may be entirely blocked and cause the base regions 140 to float.

Figure 4:
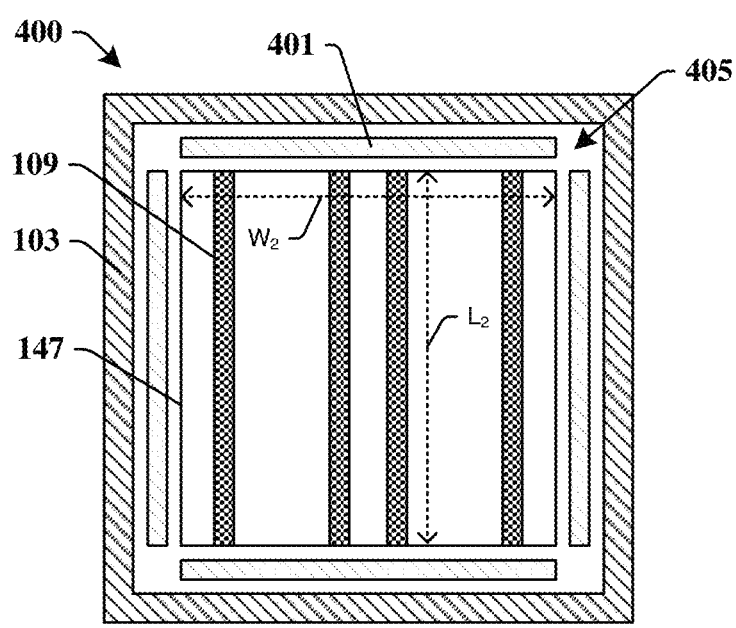

FIG. 4 illustrates a layout 400 in accordance with some other embodiments. In the layout 400, the strap is provided by four segments 401 each adjacent one side of the active area 147. The strap may be either the strap 135A of FIG. 1 or the strap 135B of FIG. 2. The segments 401 are disconnected at the corners of the active area 147 to create openings 405 in the strap. In some embodiments, the segments 401 above and below the active area 147 have a length that is approximately equal to a width $W_2$ of the active area 147. In some embodiments, the segments 401 to the left and right of the active area 147 have a length that is approximately equal to a length $L_2$ of the active area 147. In some embodiments, the width $W_2$ is the range from about 2 μm to about 300 μm. In some embodiments, the width $W_2$ is the range from about 5 μm to about 160 μm. In some embodiments, the length $L_2$ is the range from about 5 μm to about 400 μm. In some embodiments, the length $L_2$ is the range from about 10 μm to about 200 μm. In some embodiments, the active area 147 is approximately square.

Figure 5:
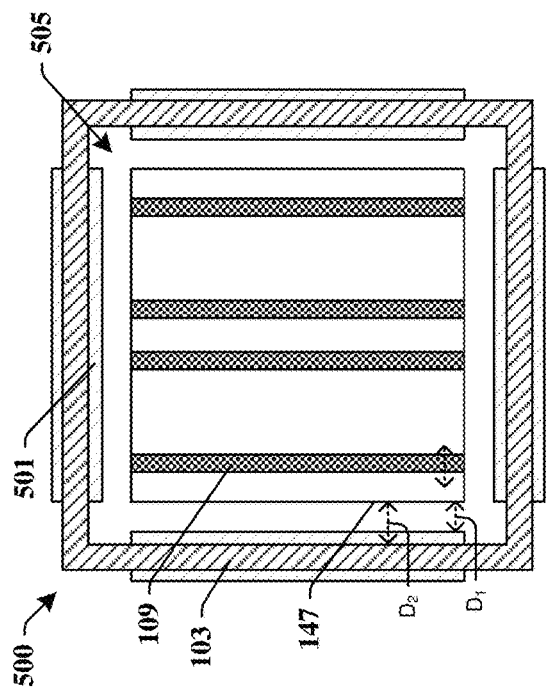

FIG. 5 illustrates a layout 500 in accordance with some other embodiments. The layout 500 is similar to the layout 400 except that in the layout 500 the strap has segments 501 that are closer to the bulk ring 103 than to the active area 147. In some embodiments, portions of the segments 501 are directly underneath the bulk ring 103. In some embodiments, the segments 501 abut the bulk ring 103. The layout 500 has openings 505 that are larger than the openings 405 of the layout 400 of FIG. 4.

Figure 6A:
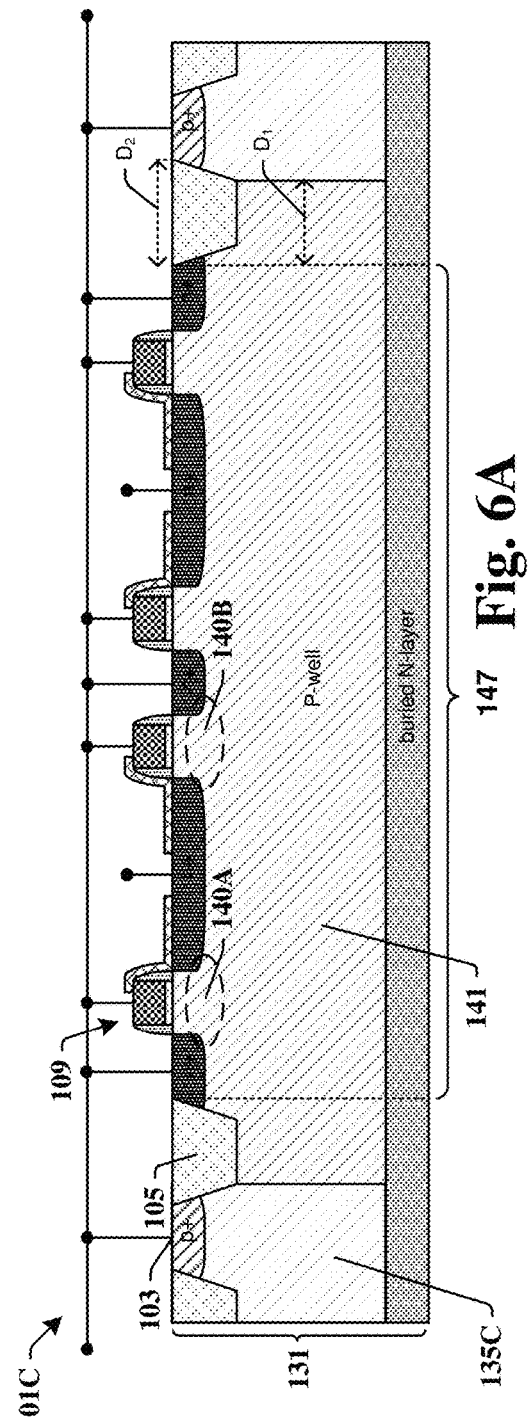

FIG. 6A illustrates an ESD protection device 101C having a strap 135C that may be composed of the segments 501. The strap 135C and the segments 501 are spaced apart from the active area 147 by a distance $D_1$. In some embodiments, the distance $D_1$ is half or more a distance D2 between the active area 147 and the bulk ring 103. In some embodiments, the distance $D_1$ is in a range from about 0.1 μm to about 10 μm. In some embodiments, the distance $D_1$ is in a range from about 0.2 μm to about 5 μm. In some embodiments, the distance $D_2$ is in a range from about 0.1 μm to about 20 μm. In some embodiments, the distance $D_2$ is in a range from about 0.5 μm to about 10 μm.

FIG. 6B illustrates an ESD protection device 101D having a strap 135D according to some other embodiments. The straps 135D may also use the layout 500. In some embodiments, the straps 135D are directly below the bulk ring 103 and extend from an inner perimeter 163 of the bulk ring 103 to an outer perimeter 161 of the bulk ring 103 so as to completely separate the bulk ring 103 from the P-well 141 underneath in some areas. However, communication between the bulk ring 103 and the P-well 141 may still occur in the area of openings 505 (see FIG. 5).

Figure 7:
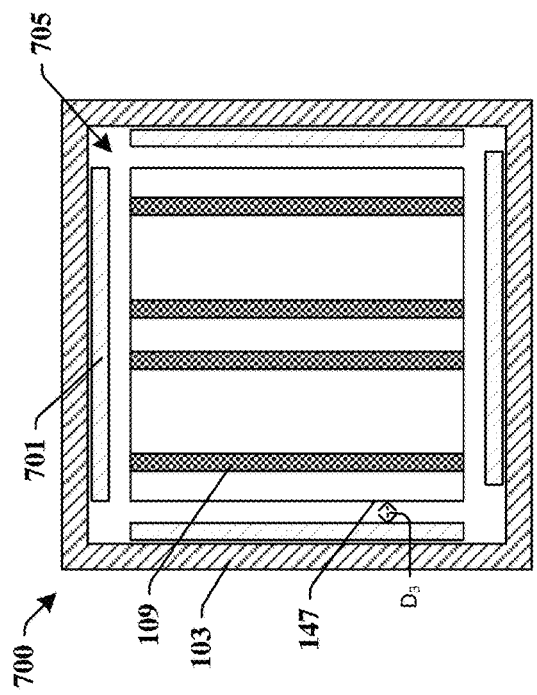
FIG. 7 illustrates a plan view of an ESD protection device according to some embodiments of the present disclosure.

FIG. 7 illustrates a layout 700 in accordance with some other embodiments. The layout 700 is similar to the layout 400 except that in the layout 700 the strap has segments 701 that are further from the active area 147 than from the bulk ring 103. The layout 700 differs from the layout 500 of FIG. 5 in that the segments 701 do not extend beyond the STI region 105. In some embodiments, the segments 701 are spaced apart from the bulk ring 103. The layout 700 has openings 705 at the corners that are smaller than the openings 405 of the layout 400 of FIG. 4.

Figure 8:
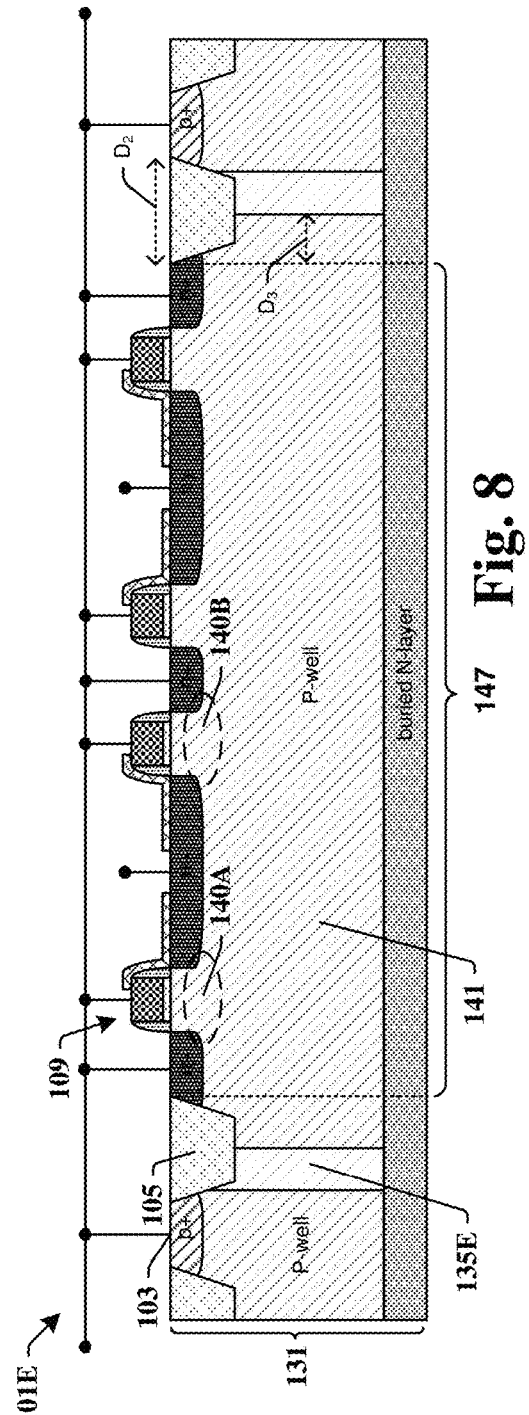
FIG. 8 illustrates a cross-sectional side view of an ESD protection device according to an embodiment that may correspond with the plan view of FIG. 7.

FIG. 8 illustrates an ESD protection device 101E having a strap 135E that may be composed of the segments 701. The strap 135E and the segments 701 are spaced apart from the active area 147 by a distance $D_3$. In some embodiments, the distance $D_3$ is half or more the distance $D_2$ between the active area 147 and the bulk ring 103. In some embodiments, the distance $D_3$ is in a range from about 0.1 μm to about 10 μm. In some embodiments, the distance $D_3$ is in a range from about 0.2 μm to about 5 μm. Moving the straps either toward or away from the active area 147 provides a means of regulating current flow between the base regions 140 (see FIG. 1) and the bulk ring 103 so as to achieve balance while maintaining overall current flow.

FIGS. 9-11 provide layouts 900-1100, which provide additional embodiments illustrating other concepts for achieving resistance-balancing. FIG. 9 illustrates the layout 900 which includes four segments 901 on four sides of the active area 147. The four segments 901 may comprise the strap 135A of FIG. 1 or the strap 135B of FIG. 2. The segments 901 are shorter than corresponding sides of the active area 147 so that the ends of the segments 901 terminate short of respective ends of the active area 147 by a distance $D_4$. In some embodiments, the distance $D_4$ is in a range from about 0.2 μm to about 100 μm. In some embodiments, the distance $D_4$ is in a range from about 0.5 μm to about 30 μm. Making the segments 901 shorter than respective sides of the active area 147 makes openings 905 at the corners of the straps 135A or 135B larger. The same principle may be applied to the straps 135C and 135D.

FIG. 9 illustrate a loop 907 around the active area 147. A strap composed of segments 901 is disposed along a majority of the length of the loop 907. In some embodiments, the strap is disposed along 90% or more of the length of the loop 907. These statements apply to all of the layouts of the present disclosure in which the strap does not fully surround the active area 147.

FIG. 10 illustrates the layout 1000. The layout 1000 is like the layout 400 of FIG. 4 but with slots 1005 of width $W_3$ formed in the segments 401, breaking them into smaller segments 1001. The pitch and spacing of the slots 1005 may be varied to regulate resistance between the base regions 140 (see FIG. 1) and the bulk ring 103. In some embodiments, the width $W_3$ of the slots 1005 is in a range from about 0.01 μm to about 20 μm. In some embodiments, the width $W_3$ is in a range from about 0.5 μm to about 5 μm. In some embodiments, the pitch Pi is the range from about 0.5 μm to about 200 μm. In some embodiments, the pitch Pi is the range from about 1 μm to about 100 μm.

FIG. 11 illustrates the layout 1100. The layout 1100 is like the layout 1000 except that the layout 1100 has slots 1105 that divide the strap into segments 1101, which are short. The segments 1101 have a length $L_1$ that is less than or equal to their width $W_1$. In some embodiments, the length $L_1$ is in a range from about 0.01 μm to about 10 μm. In some embodiments, the length $L_1$ is in the range from about 0.1 μm to about 5 μm. The slots 1105 have a width $W_6$. In some embodiments, the width $W_6$ is in a range from about 0.01 μm to about 10 μm. In some embodiments, the width $W_6$ is in a range from about 0.03 μm to about 3 μm. In some embodiments, the width $W_6$ is in a range from about 0.1 μm to about 1 μm. In the layout 1100, the corner areas 1103 may be left open for better regulation of the bulk voltage within the active area 147.

It will be appreciated that the features of layouts 1000 and 1100 of FIGS. 10 and 11 may be combined with the features of any of layouts 500, 700, and 900 of FIGS. 5, 7, and 9 to provide additional embodiments. Moreover, the segments illustrated in these layouts may be lightly P-doped like the straps 135A of FIG. 1, N-doped like the straps 135B of FIG. 2, undoped, or may be a combination thereof.

FIG. 12 illustrates a layout 1200 that is like the layout 400 of FIG. 4 except that in the layout 1200 the fingers 109 are evenly spaced across the active area 147. With reference to FIG. 2, this makes a width $W_4$ of the drain regions 115 equal to a width $W_5$ of the source regions 107. As shown by the layout 1200, in some embodiments the width $W_4$ is less than two times the width $W_5$ and may be equal to the width $W_5$. As shown by FIG. 2, in some embodiments the width $W_4$ is at least twice as large as the width $W_5$. In some embodiments the width $W_4$ is three times or more the width $W_5$. Resistance balancing according to any of the foregoing examples may be effective for any of these finger spacings.

FIG. 2 shows the active area 147 with four fingers 109. FIG. 12 shows the active area 147 with six fingers 109. These are examples only. More generally, the number of fingers 109 may be from 1 to 100. In some embodiments, there are a plurality of fingers 109. In some embodiments, the number of fingers 109 is from 4 to 40. In some embodiments, the number of fingers 109 is eight or more. The straps 135A-135E can be effective for resistance balancing regardless of the number and thickness of the fingers 109.

In some embodiments, the width $W_4$ of the drain regions 115 is in the range from about 0.1 μm to about 20 μm. In some embodiments, the width $W_4$ is in the range from about 0.2 μm to about 6 μm. In some embodiments, the width $W_5$ of the source regions 107 is in the range from about 0.1 μm to about 20 μm. In some embodiments, the width $W_5$ is in the range from about 0.2 μm to about 6 μm.

The previous examples have illustrated an active area 147 that is square. However, the active area 147 may be rectangular or otherwise shaped. The previous examples have illustrated layouts that are the same on each side of the active area 147. However, different layouts may be used on different sides. Furthermore, as shown by the examples given below, segments may be eliminated altogether from some sides. As shown by examples given below, the straps 135A-135D may have segments selectively disposed on two of the four sides of the active area.

Figure 13:
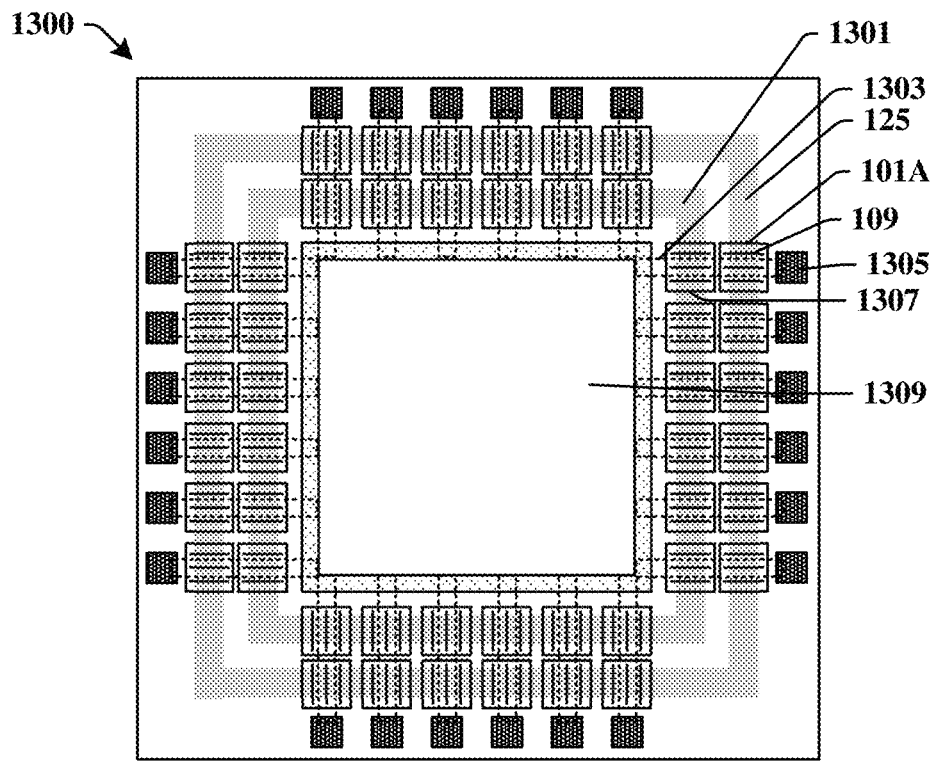
FIGS. 13-14 illustrate ICs with ESD protection devices according to some embodiments of the present disclosure.

FIG. 13 illustrates an integrated chip (IC) 1300 according to some aspects of the present disclosure. The IC 1300 has contact pads 1305 about its perimeter. ESD protection devices 101A or other ESD protection devices according to the present disclosure are positioned between the contact pads 1305 and a core area 1309. Circuits protected by the ESD protection devices 101A are in the core area 1309. The Vss rail 125 passes above the ESD protection devices 101A in a loop around the core area 1309 and forms connections with the ESD protection devices 101A.

In addition to the ESD protection devices 101A, another set of devices 1307 may be positioned between the contact pads 1305 and the core area 1309. In some embodiments, the additional devices 1307 include PMOS devices. In some embodiments, the additional devices 1307 include PMOS counterparts of the ESD protection devices 101A. A Vdd rail 1301 may pass above the additional devices 1307 in a loop around the core area 1309 and forms connections with the additional devices 1307.

Wires connecting the contact pads 1305 to the ESD protection devices 101A, the additional devices 1307, and the core area 1309 are formed in area 1303. These wires are in a first metallization layer (not shown). The Vss rail 125 and the Vdd rail 1301 are in a second metallization layer. In some embodiments, the second metallization layer is above the first metallization layer. In some embodiments, the first metallization is the M3 metallization layer. In some embodiments, the fingers 109 extend in directions that go from respective contact pads 1305 toward the core area 1309 and are perpendicular to the Vss rail 125. These configurations facilitate making the wiring connections.

The active area 147 (see FIG. 1) of the ESD protection device 101A may be rectangular and have four sides. In the IC 1300, a first side faces a corresponding contact pad 1305. A second side faces the core area 1309. The third side and the fourth side run parallel to the fingers 109. The straps 135A (see FIG. 1) may have segments on all four sides of the active area.

Figure 14:
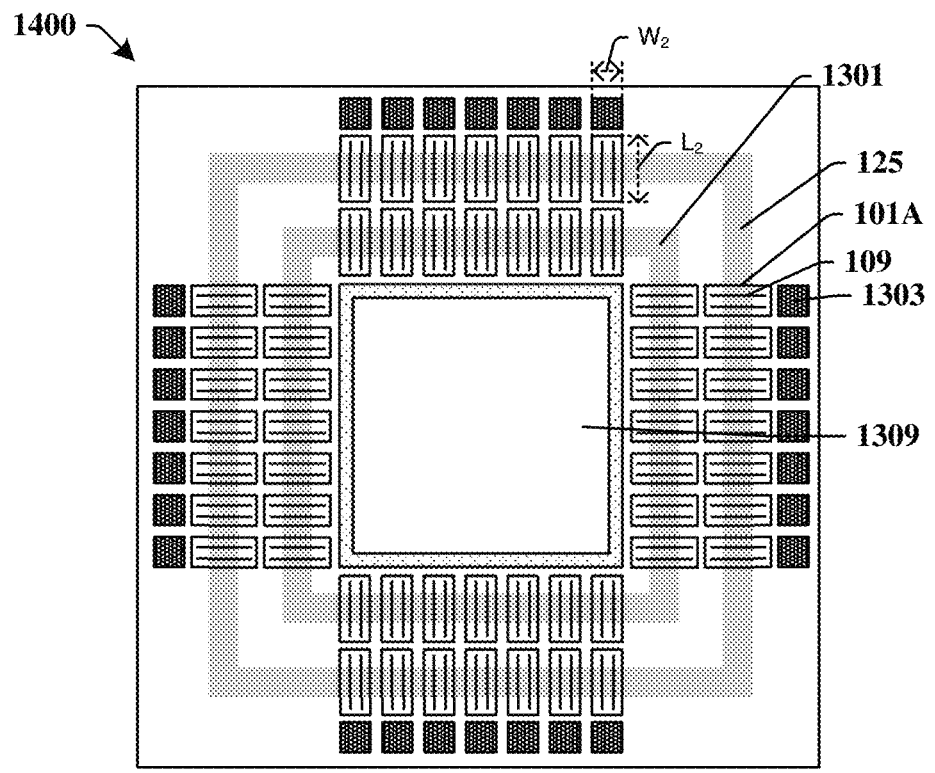

FIG. 14 illustrates an integrated chip (IC) 1400 according to some other aspects of the present disclosure. The IC 1400 has contact pads 1305 that are more closely spaced than the contact pads of IC 1300. In order to maintain area, the active areas 147 of the ESD protection devices 101A in the IC 1400 have a length $L_2$ that is greater than their width $W_2$. In some embodiments, $L_2$ is at least 50 percent greater than $W_2$. In some embodiments, $L_2$ is at least twice $W_2$. In some embodiments, $L_2$ is at least three times $W_2$.

FIGS. 15 to 22 illustrate layouts 1500 to 2200 that are non-limiting example of layouts for the ESD protection devices 101A or other ESD protection devices used in the IC 1400. In all these examples, the straps have segments selectively on only two sides of the active area 147. The segments are on the longer sides of the active areas 147 and run parallel to the fingers 109.

Figure 15:
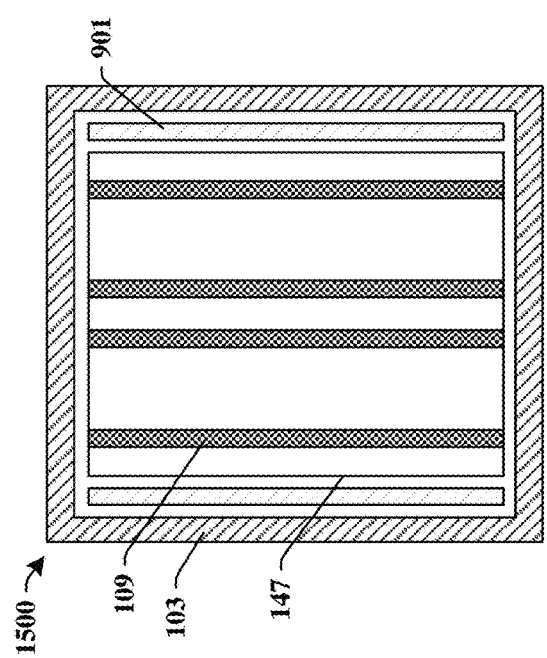
Figure 16:
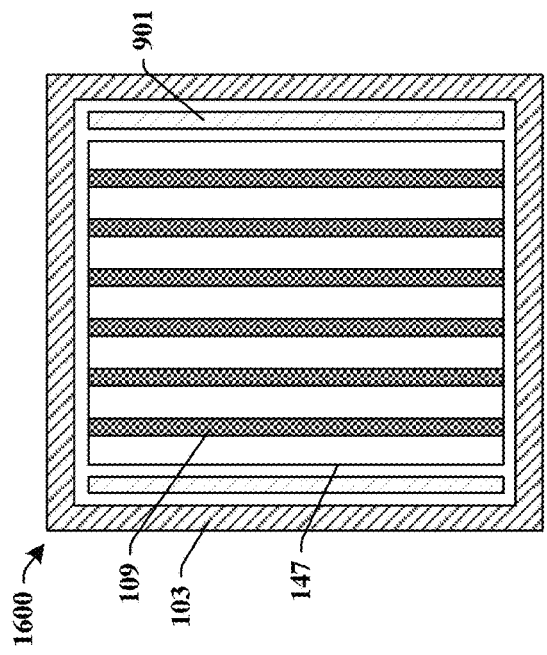

FIG. 15 illustrates the layout 1500. The layout 1500 is like the layout 900 of FIG. 9 in that the layout 1500 includes segments 901 that are approximately the same length as the fingers 109 and the active area 147. However, the layout 1500 uses only two of the segments 901. FIG. 16 illustrates the layout 1600 which is like the layout 1500 except that in the layout 1600 the fingers 109 are evenly spaced.

Figure 17:
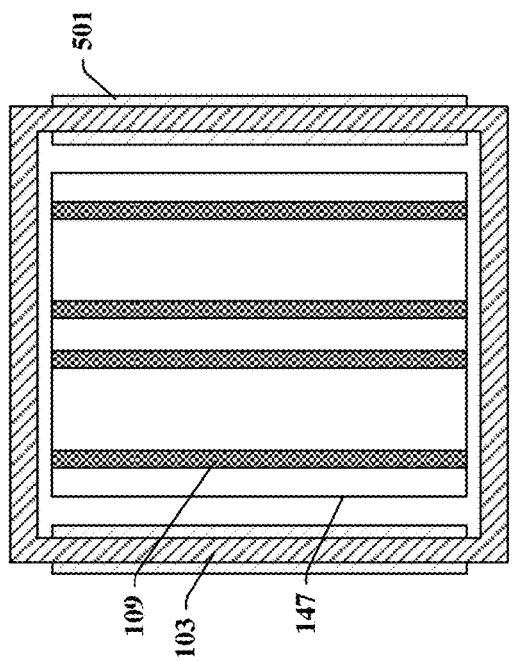
Figure 18:
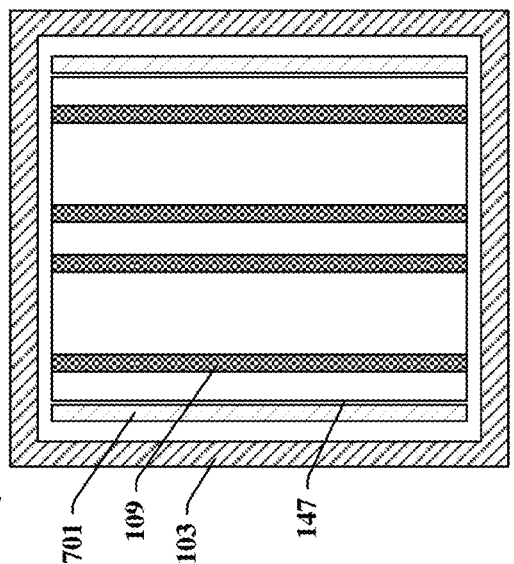

FIG. 17 illustrates the layout 1700. The layout 1700 is like the layout 500 of FIG. 5 in that the layout 1700 includes two segments 501 that extend underneath the bulk ring 103 and are closer to the bulk ring 103 than to the active area 147. FIG. 18 illustrates the layout 1800. The layout 1800 is like the layout 700 of FIG. 7 in that the layout 1800 includes two segments 701 that closer to the active area 147 than to the bulk ring 103.

FIG. 19 illustrates the layout 1900. The layout 1900 is like the layout 1000 of FIG. 10 in that the layout includes segments 401 divided into smaller segments 1001 by slots 1005. FIG. illustrates the layout 2000. The layout 2000 is like the layout 1100 of FIG. 11 in that the layout 2000 has a strap with many slots 1105 that divide the strap into segments 1101 that have a length $L_1$ that is less than or equal to their width $W_1$.

FIG. 21 illustrates the layout 2100. The layout 2100 is like the layout 900 of FIG. 9 in that the layout 2100 includes segments 901 that terminate a distance $D_4$ short of alignment with an end of the active area 147. FIG. 22 illustrates the layout 2200. The layout 2200 combines features of the layout 1900 and the layout 2100 in that the layout 2200 includes segments 1001 separated by slots 1005 and the endmost segment 1001 is a distance $D_4$ from the edge of the active area 147. It will be appreciated that the features of other layouts may likewise be combined and that the segments may be either lightly P-doped areas or N-doped areas. In the layout 2200 and potentially in any of these other combinations, the segments 1001 and/or other segments collectively occupy a majority of the length of a loop 2201 around the active area 147.

Figure 23:
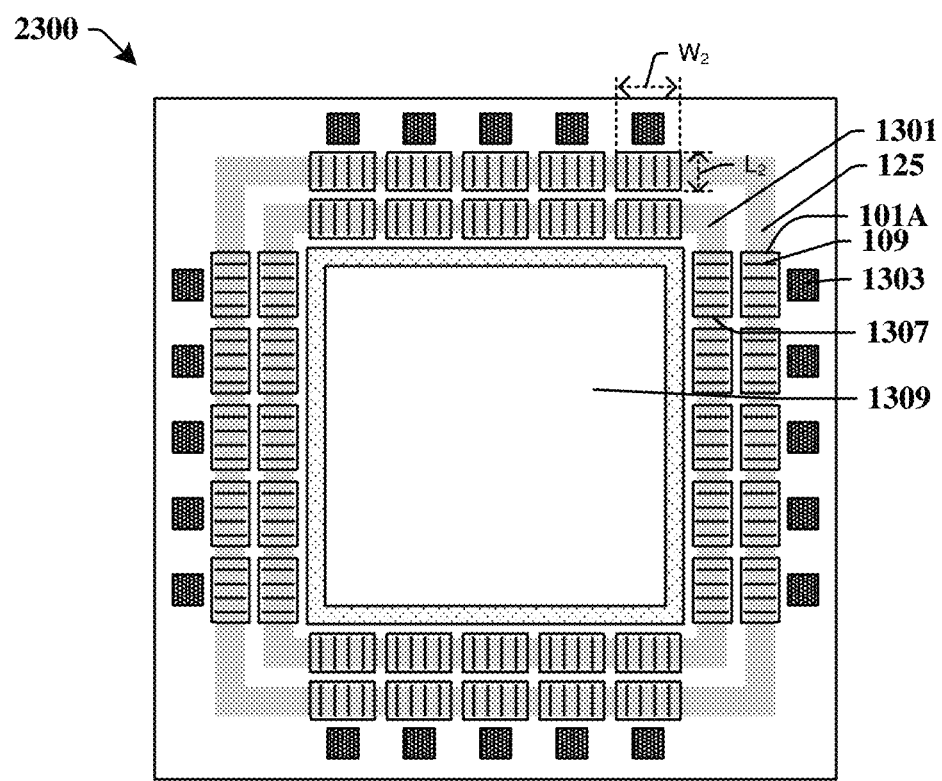
FIG. 23 illustrates an IC with ESD protection device according to some embodiments of the present disclosure.

FIG. 23 illustrates an integrated chip (IC) 2300 according to some other aspects of the present disclosure. The IC 2300 has a core area 1309 that is larger than in the IC 1300 of FIG. 13. In order to accommodate that larger core area 1309, the active areas 147 of the ESD protection devices 101A or other ESD protection devices in the IC 2300 have a width $W_2$ that is greater than their length $L_2$. In some embodiments, $W_2$ is at least 50 percent greater than $L_2$. In some embodiments, $W_2$ is at least twice $L_2$. In some embodiments, $W_2$ is at least three times $L_2$.

FIGS. 24 to 31 illustrate layouts 2400 to 3100 that are non-limiting example of layouts that may be used for the straps in the ESD protection devices 101A in the IC 2300. In all these examples, the straps have segments on only two sides of the active area 147. The segments are on the longer sides of the active areas 147 and run perpendicular to the fingers 109.

Figure 24:
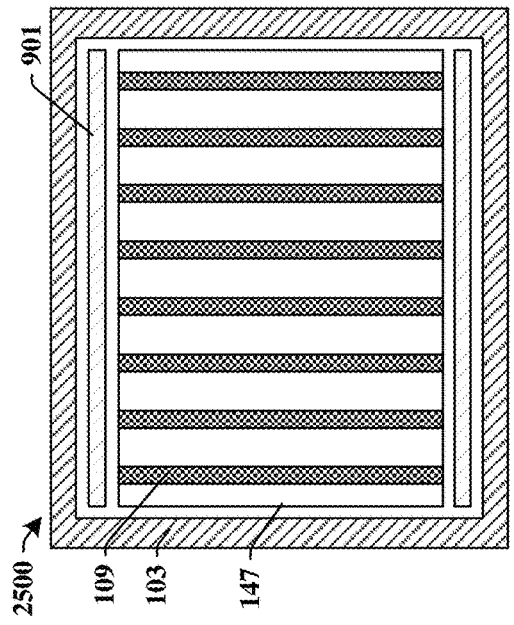
FIGS. 24-31 illustrate plan views of ESD protection devices according to various embodiments of the present disclosure that may be used in the IC of FIG. 23.
Figure 25:
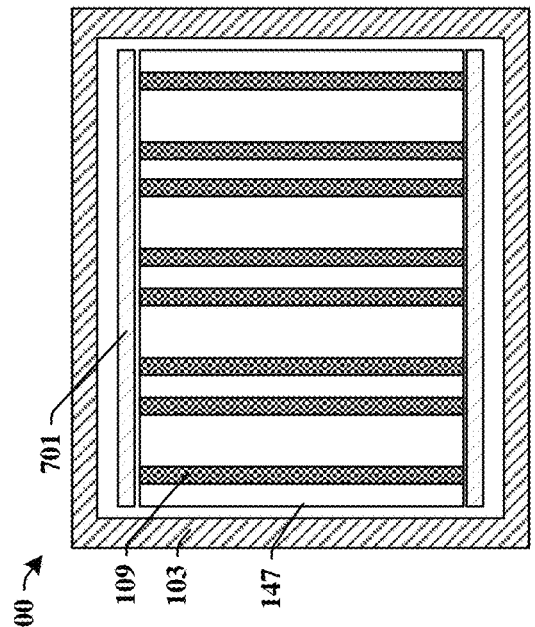

FIG. 24 illustrates the layout 2400. The layout 2400 is like the layout 900 of FIG. 9 in that the layout 2400 includes segments 901 that are approximately the same width as the active area 147. However, the layout 2400 uses only two of the segments 901. FIG. 25 illustrates the layout 2500 which is like the layout 2400 except that in the layout 2500 the fingers 109 are evenly spaced.

Figure 26:
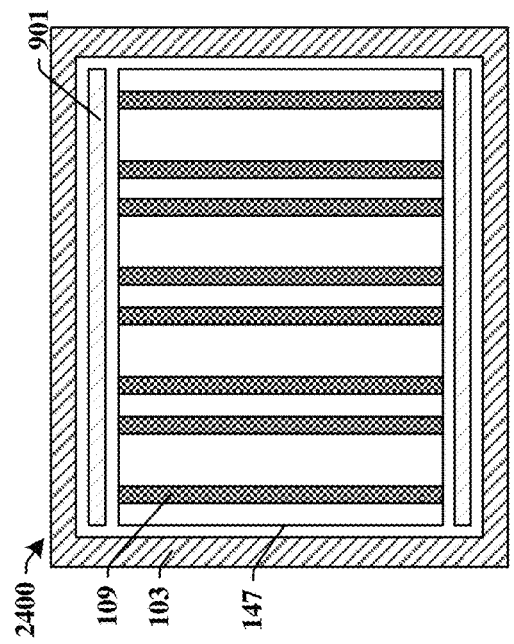
Figure 27:
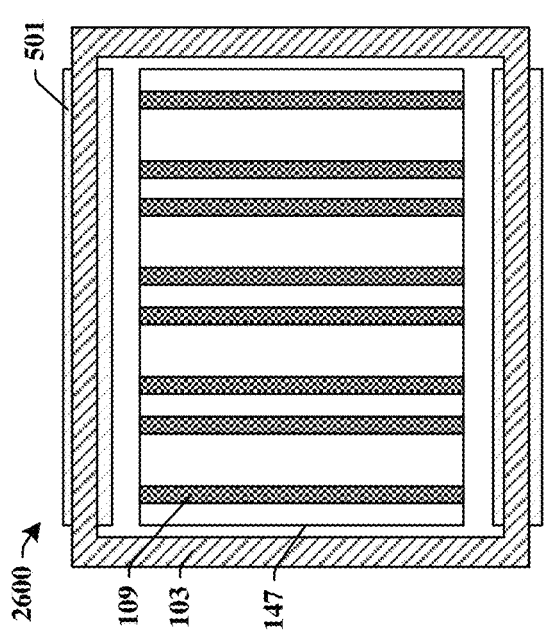

FIG. 26 illustrates the layout 2600. The layout 2600 is like the layout 500 of FIG. 5 in that the layout 1700 includes two segments 501 that extend underneath the bulk ring 103 and are closer to the bulk ring 103 than to the active area 147. FIG. 27 illustrates the layout 2700. The layout 2700 is like the layout 700 of FIG. 7 in that the layout 2700 includes two segments 701 that closer to the active area 147 than to the bulk ring 103.

Figure 29:
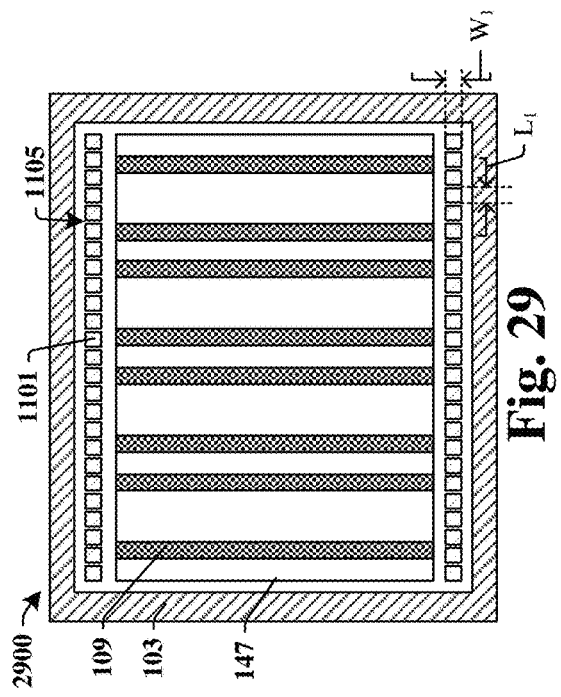
Figure 28:
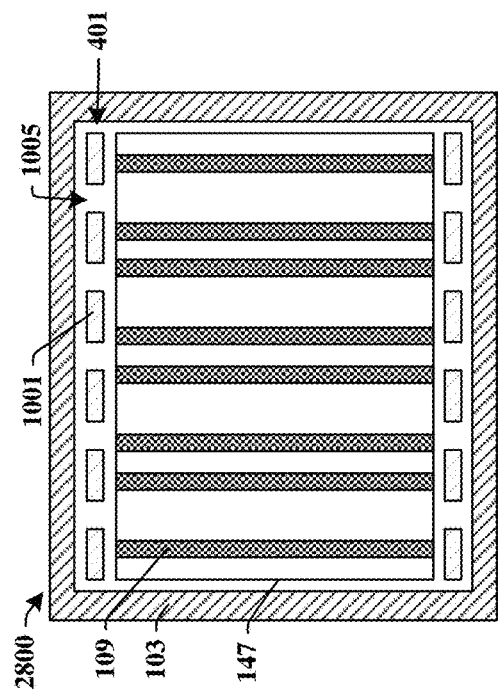

FIG. 28 illustrates the layout 2800. The layout 2800 is like the layout 1000 of FIG. 10 in that the layout includes segments 401 divided into smaller segments 1001 by slots 1005. FIG. 29 illustrates the layout 2900. The layout 2900 is like the layout 1100 of FIG. 11 in that the layout 2900 has a strap with many slots 1105 that divide the strap into segments 1101 that have a length $L_1$ that is less than or equal to their width $W_1$.

Figure 31:
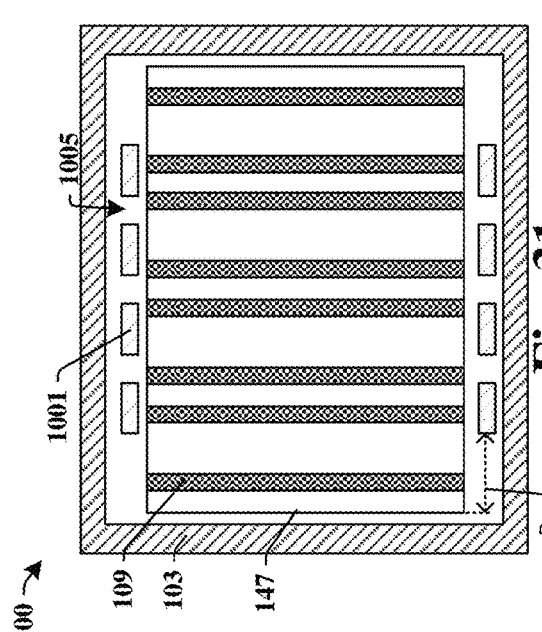
Figure 30:
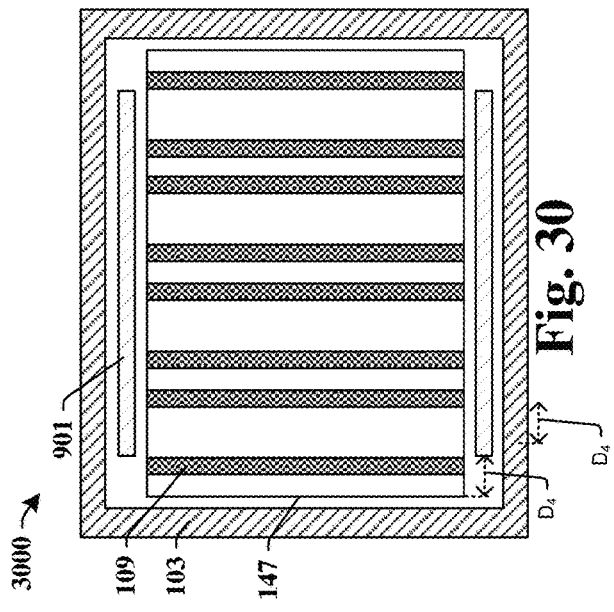

FIG. 30 illustrates the layout 3000. The layout 3000 is like the layout 900 of FIG. 9 in that the layout includes segments 901 that terminate a distance $D_4$ short of alignment with an end of the active area 147. FIG. 31 illustrates the layout 3100. The layout 3100 combines features of the layout 2800 and the layout 3000. The layout 2200 includes segments 1001 separated by slots 1005 and the endmost segment 1001 is a distance $D_4$ from the edge of the active area 147. It will be appreciated that the features of other layouts may likewise be combined and that the segments may be either lightly P-doped areas or N-doped areas.

Having segments on only two sides of the active area 147 may leave low resistance pathways between the bulk ring and some base regions 140 (see FIG. 1). These may cause some areas of an ESD protection device 101A to switch off while others remain active. However, the area of the ESD protection device 101A that is switched off by the low resistance pathways may be small compared to the area that remains active. Accordingly, the area that remains active does not experience undue current load and the resistance balancing is sufficient.

FIGS. 32 through 42 are cross-sectional view illustrations exemplifying a method according to the present disclosure of forming an IC with an ESD protection device of the present disclosure. While FIGS. 32 through 42 are described with reference to various embodiments of a method, it will be appreciated that the structures shown in FIGS. 32 through 42 are not limited to the method but rather may stand alone separate from the method. FIGS. 32 through 42 are described as a series of acts. The order of these acts may be altered in other embodiments. While FIGS. 32 through 42 illustrate and describe a specific set of acts, some may be omitted in other embodiments. Further, acts that are not illustrated and/or described may be included in other embodiments. While the method of FIGS. 32 through 42 illustrates the formation of the ESD protection device 101A, the method may be used to form other ESD protection devices of this disclosure.

As shown by the cross-sectional view 3200 of FIG. 32, the method may begin with provision of the semiconductor substrate 131. The semiconductor substrate 131 may be a bulk semiconductor, a silicon-on-insulator (SOI) type structure, or any other type of semiconductor body. The semiconductor may be silicon, or another semiconductor material such as SiGe and/or other group III, group IV, and/or group V element, combination thereof, or the like. In some embodiments, the semiconductor substrate 131 is provided with the buried N-layer 133. The semiconductor substrate 131 also includes the upper portion 3201. In some embodiments, the upper portion 3201 has P-type doping to a concentration in the range from about $10^{12}/cm^3$ to about $10^{15}/cm^3$. In some embodiments, the buried N-layer 133 is formed followed by epitaxial growth of the upper portion 3201.

As show by the cross-sectional view 3300 of FIG. 33, the method may continue with formation of the mask 3303 followed by etching to form the trenches 3301. The mask 3303 and similar masks used in this method may be formed by photolithography. The etching may be a wet etch or a plasma etch. After etching, the mask 3303 is stripped.

As show by the cross-sectional view 3400 of FIG. 34, a dielectric may be deposited to fill the trenches 3301 and form STI regions 105. After deposition, excess dielectric may be removed with a planarization process such as chemical mechanical polishing (CMP). Alternatively, isolation structures may be formed by oxidation. In some embodiments, the STI regions 105 are silicon dioxide or the like although another dielectric may be used.

Figure 35:
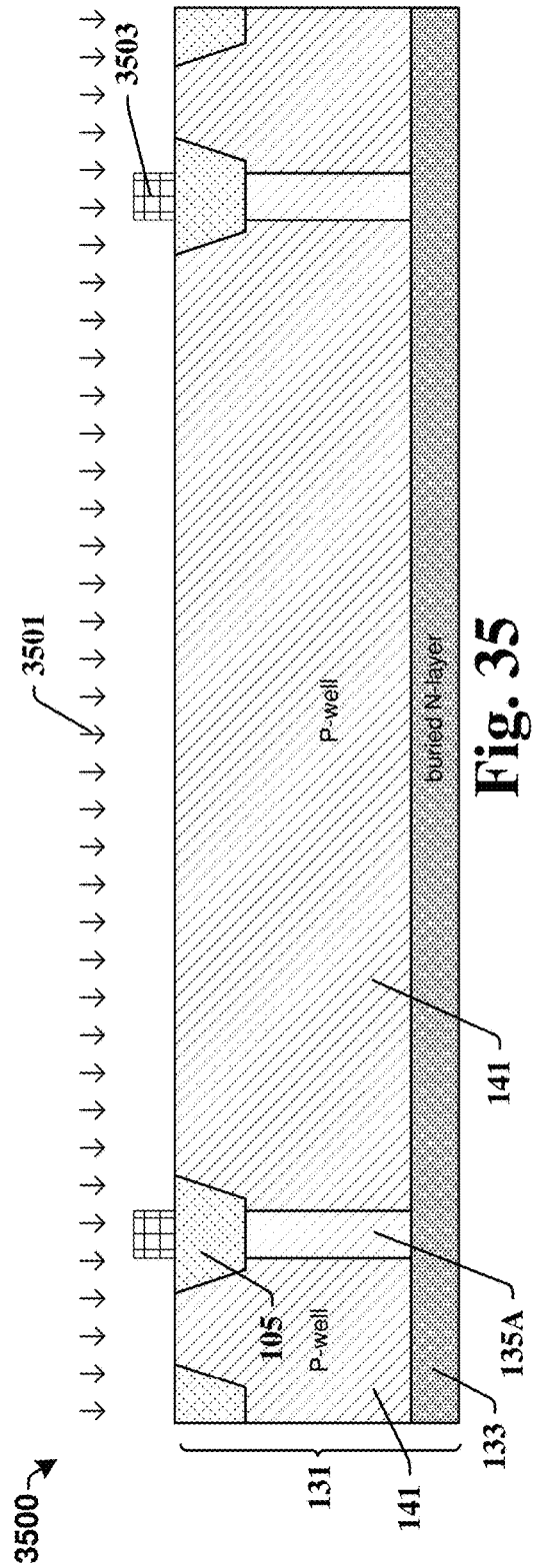

As show by the cross-sectional view 3500 of FIG. 35, a mask 3503 may be formed follow implantation of a P-type dopant 3501 to form P-well 141. The same implantation may be used for other devices in the same integrated circuit including devices in the core area 1309 (see FIG. 13). The mask 3503 leaves an area of the upper portion 3201 undoped or with only light P-type doping so as to form the strap 135A. After doping, the mask 3503 may be stripped.

Figure 36:
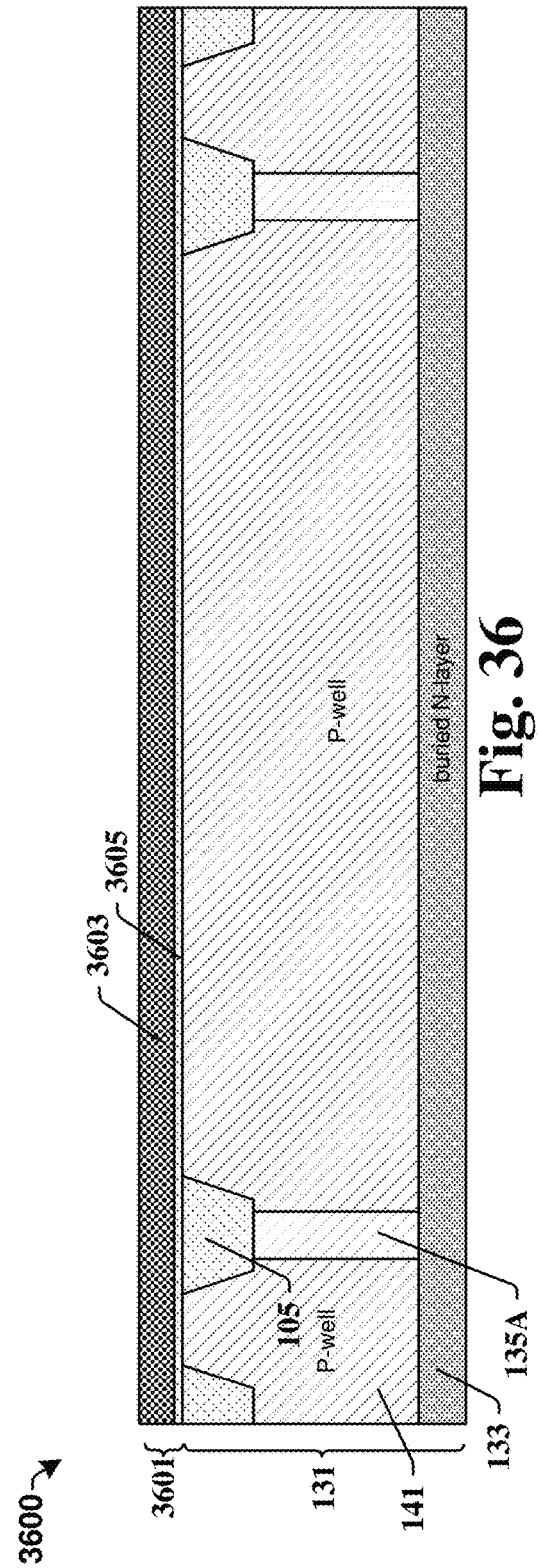

As show by the cross-sectional view 3600 of FIG. 36, a gate stack 3601 may be formed. The gate stack 3601 includes a gate dielectric layer 3605 and an electrode layer 3603. The gate dielectric layer 3605 may be or comprise silicon oxide, a high κ dielectric, the like, some other suitable dielectric(s), or any combination of the foregoing. The electrode layer 3603 may be or comprise doped polysilicon, metal, the like, some other suitable conductive material, or a combination of the foregoing. In some embodiments the electrode layer 3603 is doped polysilicon. In some embodiments the electrode layer 3603 comprises a metal and the gate dielectric layer 3605 is a high κ dielectric. In some embodiments, the gate dielectric layer 3605 is formed by oxidation. In some embodiments, the gate dielectric layer 3605 is formed by deposition. The deposition process may be atomic layer deposition (ALD), chemical vapor deposition (CVD), physical vapor deposition (PVD), the like, or a combination of the foregoing. The electrode layer 3603 may be deposited or grown. Examples of processes that may be suitable include, ALD, CVD, PVD, electroplating, and electroless plating. The gate stack 3601 may also be a dummy gate stack and the method as illustrated modified to include a gate replacement process.

As show by the cross-sectional view 3700 of FIG. 37, a mask 3701 may be formed and used in an etch that defines the fingers 109 from the gate stack 3601. The etch may be a plasma etch or the like. As show by the cross-sectional view 3800 of FIG. 38, sidewall spacers 113 may then be formed on the sides of the finger 109. Forming the sidewall spacers 113 may include depositing a spacer material and then performing an anisotropic etch that leaves only the material that forms the sidewall spacers 113. The spacer material may be or comprise silicon nitride (SiN), silicon oxynitride (SiON), silicon carbonitride (SiCN), the like, or any other suitable dielectric. The sidewall spacers 113 may comprises several layers of various materials.

As show by the cross-sectional view 3900 of FIG. 39, a mask 3903 may be formed followed by implantation of an N-type dopant 3901 to form the source regions 107 and the drain regions 115. The source regions 107 and the drain regions 115 are self-aligned to the fingers 109. The implantation provides heavy doping. Heavy doping is doping to a concentration of at least about $10^{20}/cm^3$. As show by the cross-sectional view 4000 of FIG. 40, a mask 4003 may be formed followed by implantation of a P-type dopant 4001 to form the bulk ring 103. In some embodiments, the bulk ring 103 is doped to a concentration of at least $10^{20}/cm^3$.

As show by the cross-sectional view 4100 of FIG. 41, the process continues with deposition of an RPO layer 4101.

The deposition process may be ALD, CVD, PVD, the like, or a combination of the foregoing. The RPO may be an oxide such as silicon dioxide ($SiO_2$) or the like. Alternatively, the RPO layer may be silicon nitride (SiN), silicon oxynitride (SiON), a combination thereof, or the like. As shown by the cross-sectional view 4200 of FIG. 42, a mask 4201 is then formed followed by etching to define the RPO layers 114. The process may continue with silicide formation on exposed areas of the bulk ring 103, the source regions 107, the drain regions 115, and the gate electrodes 111 followed by formation of a metal interconnect to produces an IC with the ESD protection device 101A of FIG. 1.

FIGS. 43 and 44 provide cross-sectional view 43 and 44, which illustrate a variation on the foregoing process. As show by the cross-sectional view 4300 of FIG. 43, implantation of the P-type dopant 3501 takes place without the mask 3503 (see FIG. 35). As show by the cross-sectional view 4400 of FIG. 44, a mask 4403 is formed. An N-type dopant 4401 is implanted to form the strap 135B in the P-well 141 while the mask 4403 covers other areas of the P-well 141. Further processing as illustrated above produces an IC with the ESD protection device 101B of FIG. 2.

Figure 45:
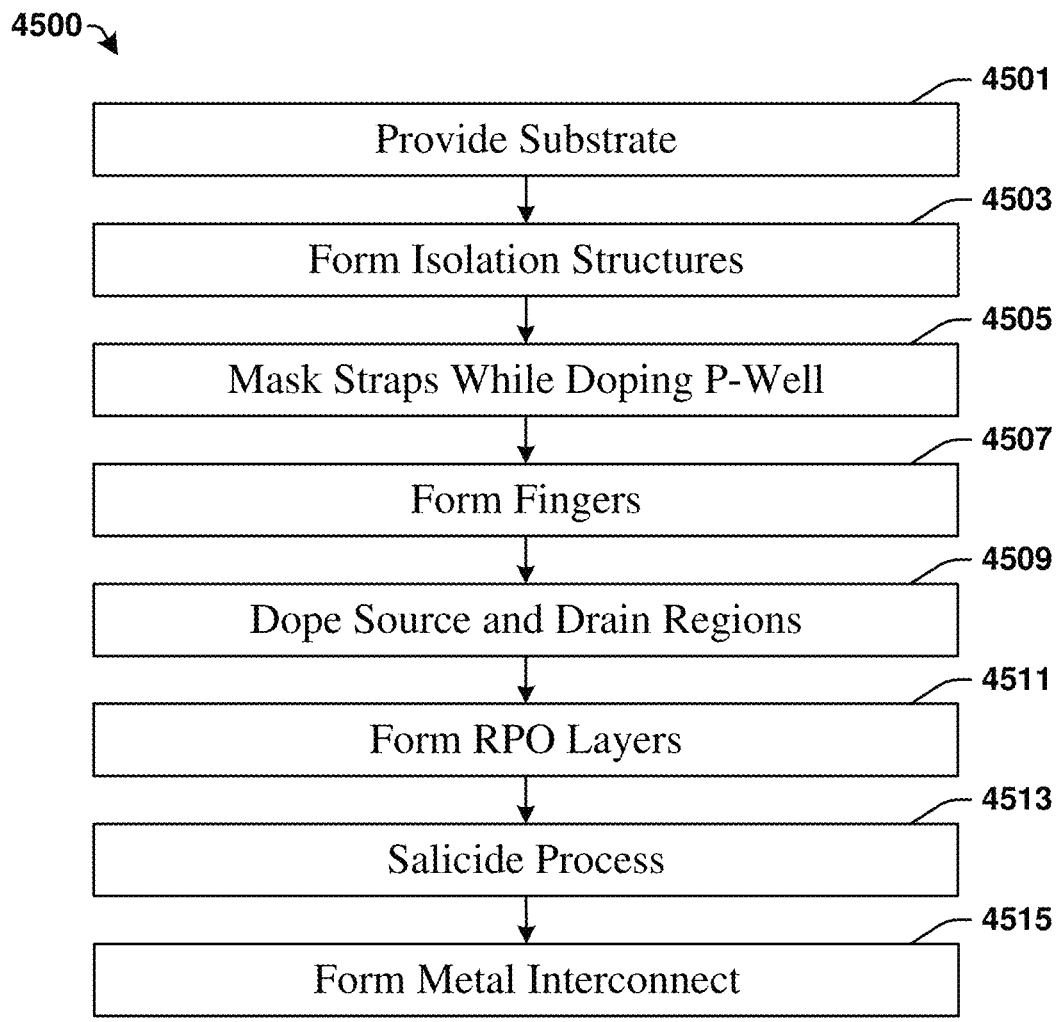
FIGS. 45-46 provide flow charts illustrating methods of the present disclosure for forming ESD devices according to the present disclosure.

FIG. 45 presents a flow chart for a process 4500 that may be used to form an IC with an ESD protection device according to the present disclosure. While the process 4500 of FIG. 45 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 4500 may begin with act 4501, providing a semiconductor substrate. The cross-sectional view 3200 of FIG. 32 provides an example. As shown in that example, the substrate may include a buried N-layer and a lightly P-doped upper layer.

The process continues with act 4503, forming isolation structures. The cross-sectional views 3300 and 3400 of FIGS. 33 and 34 provide an example. As shown in that example, the isolation structures may be STI structures. Alternatively, the isolation structures may be field oxide or some other type of isolation structure. The isolation structures define an active area.

The process continues with act 4505, forming a mask and doping to form a P-well. Resistance balancing straps are formed in areas covered by the mask. The cross-sectional view 3500 of FIG. 35 provides an example. Optionally, this doping takes place before act 4503, forming the isolation structures.

The process continues with act 4507, forming fingers. The fingers are elongated gates. Act 4507 may include forming a gate stack, patterning the gate stack to form the gates, and forming sidewall spacers for the gates. The cross-sectional views 3600 to 3800 of FIGS. 36 to 38 provide an example. Forming the fingers may also include a replacement gate process to form high-κ metal gates.

The process continues with act 4509, doping to form source and drain regions. The cross-sectional views 3900 and 4000 of FIGS. 39 and 40 provide an example. The doping may include forming masks and implanting ions.

The process continues with act 4511, forming RPO layers. This may include depositing the RPO material, forming a mask, and etching. The cross-sectional views 4100 and 4200 of FIGS. 41 and 42 provide an example. Alternatively, portions of the substrate may be covered by a mask while the RPO layers are formed by oxidation or the like. The process may continue with act 4513, forming silicide in areas that are not covered by the RPO layers or the like and act 4515, back-end-of-line (BEOL) processing to form a metal interconnect.

Figure 46:
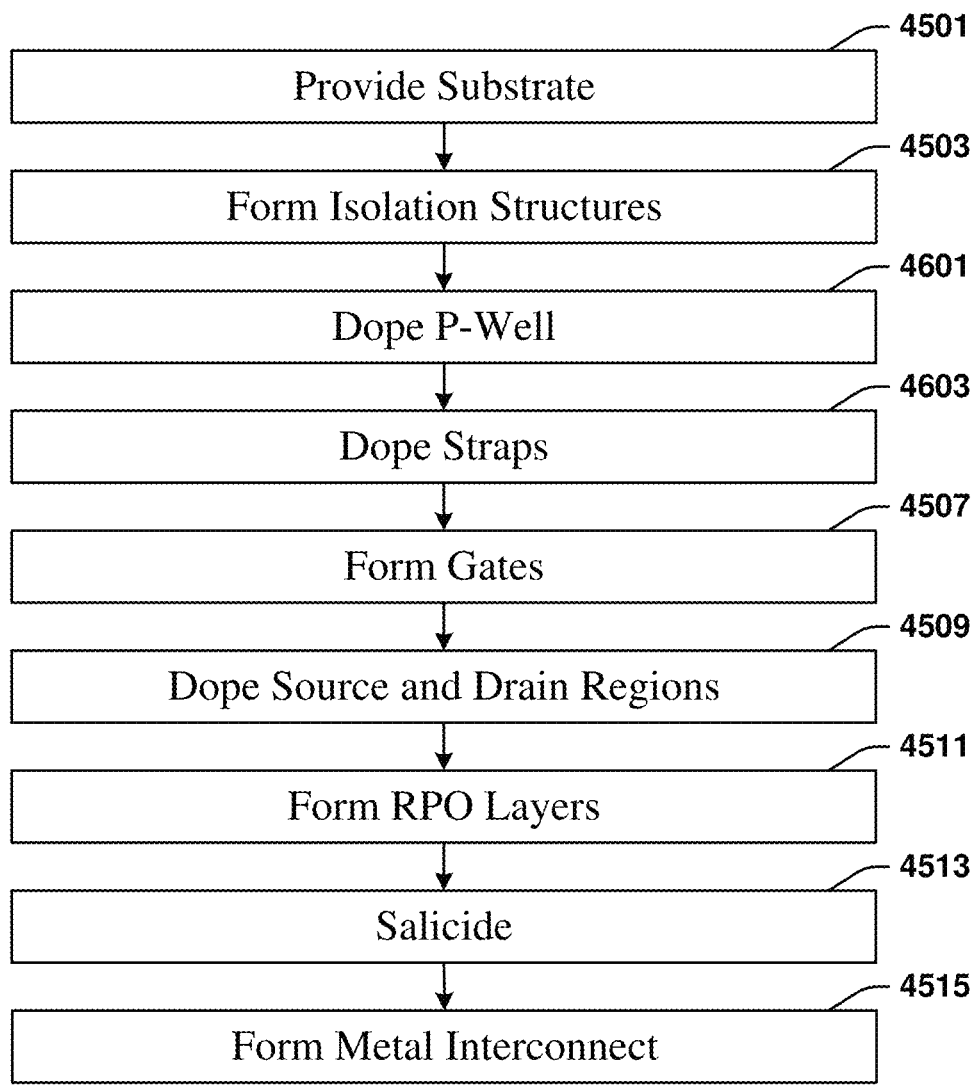

FIG. 46 provides a flow chart of a process 4600, which is a variation of the process 4500 of FIG. 45. The process 4600 differs in that it uses act 4601 in which the P-well is doped without masking the desired locations for straps. The cross-sectional view 4300 of FIG. 43 provides an example. Instead, the process 4600 uses act 4603 to form the straps. Act 4603 is N-doping the straps while masking other areas of the P-well. The cross-sectional view 4400 of FIG. 44 provides an example.

Some aspects of the present disclosure relate to an integrated circuit device having a semiconductor substrate, a P-well, an active area surrounded by an isolation structure, an N-channel grounded-gate metal-oxide-semiconductor (ggNMOS) electrostatic discharge device, and a strap. The ggNMOS device is over the P-well and includes a plurality of MOSFET fingers that are disposed within the active area. A heavily P-doped region of the semiconductor substrate outside the active area and surrounding the active area provides a bulk ring for the ggNMOS electrostatic discharge device. The strap is a region of the semiconductor substrate that has a lighter P-type doping than the P-well or has an N-type doping. The strap is below or within the bulk ring. In some embodiments, the IC device includes a buried n-layer in the semiconductor substrate below the P-well and directly below both the bulk ring and the active area. The strap extends down to the buried n-layer. In some embodiments the strap is directly beneath the isolation structure. In some embodiments the strap is closer to the bulk ring than to the active area. In some embodiments the strap comprises a segment having a length that is shorter than a corresponding side of the active area. In some embodiments the strap is slotted. In some embodiments the active area is rectangular, and the strap is selectively disposed on two of the four sides of the active area. In some embodiments the MOSFET fingers run parallel to the strap. In some embodiments the MOSFET fingers run perpendicular to the strap. In some embodiments the strap comprises segments on each of the four sides. In some embodiments the segments corresponding to the four sides are disconnected from one another.

Some aspects of the present disclosure relate to an integrated circuit device comprising a semiconductor substrate that includes an active area surrounded by an isolation structure. A ggNMOS electrostatic discharge device is formed over a P-well of the semiconductor substrate. The ggNMOS device includes a first finger and a second finger disposed within the active area. A substrate contact for the ggNMOS electrostatic discharge device is outside the active area. A resistance-balancing strap is formed in the semiconductor substrate between the substrate contact and the active area. A first base region provided by the P-well is directly below the first finger. A second base region provided by the P-well is directly below the second finger. A first resistance is between the substrate contact and the first base region. A second resistance is between the substrate contact and the second base region. The first resistance is greater than the second resistance. The resistance-balancing strap has a difference in doping from the P-well that reduces a ratio of the first resistance to the second resistance. In some embodiments, the IC device further includes a contact pad and a core area that contains a circuit protected by the ggNMOS electrostatic discharge device. The ggNMOS electrostatic discharge device is disposed between the contact pad and the core area. In some embodiments, the resistance-balancing strap is disposed between the contact pad and the ggNMOS electrostatic discharge device. In some embodiments, the active area has a first side that faces the contact pad, a second side that faces the core area, and the resistance-balancing strap is along a third side. In some embodiments, the resistance-balancing strap is located along a majority of a length of a loop around the active area. In some embodiments, the resistance-balancing strap does not fully surround the active area.

Some aspects of the present disclosure relate to a method that includes providing a semiconductor substrate with a buried n-layer and a P-well over the buried n-layer, forming an isolation structure above the buried n-layer, wherein the isolation structure surrounds an active area of the semiconductor substrate, forming a bulk ring by heavily P-doping a region of the semiconductor substrate outside the isolation structure and directly above the P-well, forming a ggNMOS electrostatic discharge device directly over the P-well in the semiconductor substrate, wherein the ggNMOS electrostatic discharge device comprises a plurality of fingers within the active area, forming a strap in the semiconductor substrate outside the active area. The strap is a region of the semiconductor substrate that has a lighter P-type doping than the P-well or has an N-type doping. The strap is below or within the bulk ring. The strap extends down to the buried n-layer. In some embodiments forming the strap comprises masking a location for the strap while doping to form the P-well. In some embodiments forming the strap comprises implanting an N-type dopant. In some embodiments the strap is directly beneath the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a semiconductor substrate comprising an active area surrounded by an isolation structure, wherein the semiconductor substrate comprises a body region inside the active area, a bulk region outside the active area, and a strap between the body region and the bulk region;
an N-channel grounded-gate metal-oxide-semiconductor (ggNMOS) electrostatic discharge device formed over the body region and comprising a plurality of MOSFET fingers disposed on the body region within the active area, wherein the body region has P-type doping and provides base regions for the MOSFET fingers; and
a bulk ring for the ggNMOS electrostatic discharge device in the bulk region, wherein the bulk region has P-type doping and the bulk ring has heavy P-type doping;
wherein the strap contacts the body region and the bulk region; and
the strap, the body region, and the bulk region all have P-type doping, but the strap has a lower P-type dopant concentration than the body region and the bulk region.

2. The integrated circuit device of claim 1, further comprising:
a buried n-layer in the semiconductor substrate directly below the bulk region, the strap, and the body region ;
wherein the strap extends down to the buried n-layer.

3. The integrated circuit device of claim 1, wherein the strap is directly beneath the isolation structure.

4. The integrated circuit device of claim 1, wherein:
the active area is rectangular, having four sides; and
the strap comprises segments on each of the four sides.

5. The integrated circuit device of claim 1, further comprising a Vss rail coupled to a gate region of the plurality of MOSFET fingers, a source region of the plurality of MOSFET fingers, and the bulk ring.

6. The integrated circuit device of claim 1, wherein the ggNMOS electrostatic discharge device is disposed between an I/O pad and a core circuit that is protected by the ggNMOS electrostatic discharge device.

7. The integrated circuit device of claim 2, wherein the buried n-layer provides electrical isolation between a first portion of the semiconductor substrate that is above the buried n-layer and a second portion of the semiconductor substrate that is below the buried n-layer.

8. An integrated circuit device, comprising:
a semiconductor substrate comprising an active area surrounded by an isolation structure;
a ggNMOS electrostatic discharge device formed over a P-well of the semiconductor substrate and comprising a first finger and a second finger disposed within the active area;
a substrate contact for the ggNMOS electrostatic discharge device outside the active area; and
a resistance-balancing strap in the semiconductor substrate between the substrate contact and the active area;
a first base region provided by the P-well below the first finger; and
a second base region provided by the P-well below the second finger;
wherein a first resistance is between the substrate contact and the first base region;
a second resistance is between the substrate contact and the second base region;
the first resistance is greater than the second resistance;
the resistance-balancing strap has the same doping type as the P-well, but has a lower doping concentration; and
the resistance-balancing strap reduces a ratio of the first resistance to the second resistance.

9. The integrated circuit device of claim 8, further comprising
a contact pad; and
a core area;
wherein the ggNMOS electrostatic discharge device is disposed between the contact pad and the core area; and
the resistance-balancing strap is disposed between the contact pad and the ggNMOS electrostatic discharge device.

10. The integrated circuit device of claim 8, further comprising
a contact pad; and
a core area;
wherein the active area is rectangular;
the active area has a first side that faces the contact pad;
the active area has a second side that faces the core area; and
the active area has a third side that faces the resistance-balancing strap.

11. The integrated circuit device of claim 8, wherein the resistance-balancing strap is located along a majority of a length of a loop around the active area.

12. The integrated circuit device of claim 8, wherein the resistance-balancing strap is directly beneath the isolation structure.

13. A method comprising:
    providing a semiconductor substrate that includes a buried n-layer, an upper semiconductor layer over the buried n-layer, and a lower semiconductor below the buried n-layer, wherein the buried n-layer electrically isolates the upper semiconductor layer from the lower semiconductor;
    forming an isolation structure above the buried n-layer, wherein the isolation structure surrounds an active area of the upper semiconductor layer;
    masking a strap area and doping to form a P-well in the upper semiconductor layer around the strap area, wherein the upper semiconductor layer in the strap area provides a strap having P-type doping, the strap is between an inner portion of the P-well and an outer portion of the P-well, and the strap has lighter P-type doping than the P-well;
    forming a bulk ring by heavily P-doping a region of the upper semiconductor layer outside the isolation structure, wherein the bulk ring is directly above the outer portion of the P-well;
    forming a ggNMOS electrostatic discharge device over the inner portion of the P-well, wherein the ggNMOS electrostatic discharge device comprises a plurality of fingers within the active area; and
    the strap extends down to the buried n-layer.

14. The method of claim 13, wherein the strap is directly beneath the isolation structure.

15. The method of claim 13, wherein the strap is within the bulk ring.

16. The method of claim 13, wherein the ggNMOS electrostatic discharge device is disposed between an I/O pad and a core circuit that is protected by the ggNMOS electrostatic discharge device.

17. The method of claim 13, wherein doping the upper semiconductor layer to form the P-well takes place after forming the isolation structure.

18. The method of claim 13, wherein the strap completely surrounds the active area.

19. The method of claim 13, further comprising forming a Vss rail, wherein the Vss rail is coupled to the bulk ring and to a gate and a source region of the ggNMOS electrostatic discharge device.

20. The method of claim 13, further comprising forming the upper semiconductor layer by epitaxial growth over the buried n-layer.

* * * * *